(12) United States Patent
Maruyama et al.

(10) Patent No.: US 7,812,516 B2
(45) Date of Patent: Oct. 12, 2010

(54) LIGHT-EMITTING DEVICE AND MANUFACTURING METHOD THEREOF

(75) Inventors: Tsukasa Maruyama, Tokyo (JP); Tetsuya Ikuta, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 231 days.

(21) Appl. No.: 11/987,176

(22) Filed: Nov. 28, 2007

(65) Prior Publication Data

US 2008/0122343 A1 May 29, 2008

(30) Foreign Application Priority Data

Nov. 28, 2006 (JP) ............................. 2006-320129

(51) Int. Cl.
*H05B 33/00* (2006.01)
(52) U.S. Cl. .................... 313/503; 313/502; 313/506
(58) Field of Classification Search ................. None
See application file for complete search history.

(56) References Cited

U.S. PATENT DOCUMENTS

| 7,026,755 | B2* | 4/2006 | Setlur et al. | 313/501 |
| 7,038,370 | B2* | 5/2006 | Mueller-Mach et al. | 313/485 |
| 7,319,289 | B2* | 1/2008 | Suehiro et al. | 313/485 |
| 7,327,078 | B2* | 2/2008 | Setlur et al. | 313/499 |

FOREIGN PATENT DOCUMENTS

JP 2001-127346 A 5/2001

* cited by examiner

*Primary Examiner*—Ashok Patel
(74) *Attorney, Agent, or Firm*—Rader, Fishman & Grauer PLLC

(57) ABSTRACT

A light-emitting device includes: a light-emitting element whose main emission wavelength is 410 nm or less; and one phosphor layer or more stacked to cover a light-emitting surface of the light-emitting element and containing phosphors that absorb light from the light-emitting element and wavelength-convert the absorbed light to emit light.

6 Claims, 29 Drawing Sheets

FIG.17

| ANGLE | LUMINANCE RATIO | COLOR TEMPERATURE | Ra |
|---|---|---|---|
| 0 | – | – | – |
| 10 | 0.108 | 5,003 | 94 |
| 20 | 0.285 | 5,008 | 94 |
| 30 | 0.460 | 5,008 | 94 |
| 40 | 0.615 | 5,010 | 94 |
| 50 | 0.750 | 5,007 | 94 |
| 60 | 0.859 | 5,001 | 94 |
| 70 | 0.939 | 4,995 | 94 |
| 80 | 0.982 | 4,992 | 94 |
| 82 | 0.988 | 4,992 | 94 |
| 84 | 0.993 | 4,997 | 94 |
| 86 | 0.996 | 4,993 | 94 |
| 88 | 0.999 | 4,990 | 94 |
| 90 | 1.000 | 4,993 | 94 |
| 92 | 0.998 | 4,990 | 94 |
| 94 | 0.996 | 4,992 | 94 |
| 96 | 0.993 | 4,992 | 94 |
| 98 | 0.987 | 4,995 | 94 |
| 100 | 0.981 | 4,995 | 94 |
| 110 | 0.932 | 5,005 | 94 |
| 120 | 0.852 | 5,003 | 94 |
| 130 | 0.744 | 5,005 | 94 |
| 140 | 0.614 | 5,020 | 94 |
| 150 | 0.463 | 5,024 | 94 |
| 160 | 0.301 | 5,038 | 94 |
| 170 | 0.129 | 5,017 | 94 |
| 180 | – | – | – |

| | |
|---|---|
| $\Delta$CCT= | 33 K |
| HALF POWER ANGLE= | 115 ° |

FIG.18

| ANGLE | LUMINANCE RATIO | COLOR TEMPERATURE | Ra |
|---|---|---|---|
| 0 | – | – | – |
| 10 | 0.001 | 5,120 | 93 |
| 20 | 0.002 | 5,201 | 94 |
| 30 | 0.004 | 5,004 | 94 |
| 40 | 0.004 | 5,194 | 94 |
| 50 | 0.006 | 5,282 | 94 |
| 60 | 0.017 | 5,251 | 94 |
| 70 | 0.078 | 4,887 | 94 |
| 80 | 0.304 | 4,885 | 94 |
| 82 | 0.419 | 4,871 | 94 |
| 84 | 0.571 | 4,831 | 94 |
| 86 | 0.706 | 4,739 | 93 |
| 88 | 0.826 | 4,719 | 93 |
| 90 | 0.924 | 4,666 | 93 |
| 92 | 0.996 | 4,678 | 93 |
| 94 | 1.000 | 4,746 | 93 |
| 96 | 0.917 | 4,755 | 94 |
| 98 | 0.769 | 4,808 | 94 |
| 100 | 0.614 | 4,856 | 93 |
| 110 | 0.155 | 4,973 | 94 |
| 120 | 0.050 | 4,982 | 94 |
| 130 | 0.010 | 5,235 | 94 |
| 140 | 0.004 | 5,268 | 94 |
| 150 | 0.004 | 4,985 | 94 |
| 160 | 0.002 | 5,273 | 94 |
| 170 | 0.001 | 5,048 | 95 |
| 180 | – | – | – |

| $\Delta$CCT= | 219 K | |
|---|---|---|
| HALF POWER ANGLE= | 19 ° | |

FIG.22

| ANGLE | LUMINANCE RATIO | COLOR TEMPERATURE | Ra |
|---|---|---|---|
| 0 | – | – | – |
| 10 | 0.187 | 4,434 | 96 |
| 20 | 0.350 | 4,531 | 93 |
| 30 | 0.514 | 4,572 | 93 |
| 40 | 0.654 | 4,585 | 92 |
| 50 | 0.769 | 4,600 | 92 |
| 60 | 0.867 | 4,586 | 91 |
| 70 | 0.936 | 4,599 | 92 |
| 80 | 0.979 | 4,559 | 92 |
| 82 | 0.981 | 4,576 | 91 |
| 84 | 0.995 | 4,533 | 92 |
| 86 | 0.994 | 4,588 | 92 |
| 88 | 0.999 | 4,581 | 92 |
| 90 | 1.000 | 4,579 | 92 |
| 92 | 0.996 | 4,578 | 92 |
| 94 | 0.998 | 4,553 | 92 |
| 96 | 0.997 | 4,578 | 92 |
| 98 | 0.990 | 4,545 | 92 |
| 100 | 0.987 | 4,563 | 92 |
| 110 | 0.955 | 4,541 | 92 |
| 120 | 0.897 | 4,495 | 92 |
| 130 | 0.806 | 4,496 | 92 |
| 140 | 0.706 | 4,488 | 93 |
| 150 | 0.575 | 4,447 | 93 |
| 160 | 0.432 | 4,444 | 94 |
| 170 | 0.260 | 4,367 | 95 |
| 180 | – | – | – |

| | | |
|---|---|---|
| $\Delta$CCT= | 155 K | |
| HALF POWER ANGLE= | 126 ° | |

FIG.23

| ANGLE | LUMINANCE RATIO | COLOR TEMPERATURE | Ra |
|---|---|---|---|
| 0 | – | – | – |
| 10 | 0.001 | 4,140 | 96 |
| 20 | 0.001 | 4,303 | 95 |
| 30 | 0.003 | 4,510 | 95 |
| 40 | 0.003 | 4,448 | 95 |
| 50 | 0.005 | 4,137 | 95 |
| 60 | 0.017 | 3,479 | 95 |
| 70 | 0.055 | 3,235 | 95 |
| 80 | 0.275 | 4,182 | 95 |
| 82 | 0.375 | 4,426 | 95 |
| 84 | 0.568 | 4,901 | 94 |
| 86 | 0.786 | 5,329 | 94 |
| 88 | 0.930 | 5,598 | 93 |
| 90 | 1.000 | 5,771 | 93 |
| 92 | 0.974 | 5,738 | 93 |
| 94 | 0.793 | 5,407 | 94 |
| 96 | 0.600 | 5,018 | 94 |
| 98 | 0.419 | 4,632 | 94 |
| 100 | 0.293 | 4,359 | 95 |
| 110 | 0.062 | 3,276 | 95 |
| 120 | 0.016 | 3,589 | 95 |
| 130 | 0.005 | 4,197 | 95 |
| 140 | 0.003 | 4,509 | 95 |
| 150 | 0.003 | 4,552 | 95 |
| 160 | 0.001 | 4,299 | 95 |
| 170 | 0.001 | 4,106 | 95 |
| 180 | – | – | – |

| | | |
|---|---|---|
| ΔCCT= | 1036 K | |
| HALF POWER ANGLE= | 14 ° | |

FIG.27

| ANGLE | LUMINANCE RATIO | COLOR TEMPERATURE | Ra |
|---|---|---|---|
| 0 | – | – | – |
| 10 | 0.106 | 4,880 | 91 |
| 20 | 0.279 | 4,828 | 91 |
| 30 | 0.456 | 4,802 | 91 |
| 40 | 0.615 | 4,788 | 92 |
| 50 | 0.747 | 4,771 | 92 |
| 60 | 0.850 | 4,764 | 92 |
| 70 | 0.923 | 4,740 | 92 |
| 80 | 0.973 | 4,730 | 92 |
| 82 | 0.979 | 4,736 | 92 |
| 84 | 0.986 | 4,725 | 92 |
| 86 | 0.982 | 4,731 | 92 |
| 88 | 0.967 | 4,730 | 92 |
| 90 | 1.000 | 4,723 | 92 |
| 92 | 0.976 | 4,741 | 92 |
| 94 | 0.984 | 4,741 | 92 |
| 96 | 0.969 | 4,734 | 92 |
| 98 | 0.976 | 4,736 | 92 |
| 100 | 0.970 | 4,739 | 92 |
| 110 | 0.919 | 4,734 | 92 |
| 120 | 0.856 | 4,762 | 91 |
| 130 | 0.733 | 4,780 | 91 |
| 140 | 0.614 | 4,802 | 91 |
| 150 | 0.461 | 4,811 | 91 |
| 160 | 0.289 | 4,840 | 91 |
| 170 | 0.122 | 4,830 | 91 |
| 180 | – | – | – |

| | | |
|---|---|---|
| $\Delta$CCT= | 86 K | |
| HALF POWER ANGLE= | 115 ° | |

FIG.28

| ANGLE | LUMINANCE RATIO | COLOR TEMPERATURE | Ra |
|---|---|---|---|
| 0 | – | – | – |
| 10 | 0.001 | 4,503 | 93 |
| 20 | 0.002 | 5,074 | 91 |
| 30 | 0.005 | 4,908 | 91 |
| 40 | 0.005 | 4,885 | 92 |
| 50 | 0.008 | 4,952 | 91 |
| 60 | 0.026 | 4,789 | 92 |
| 70 | 0.126 | 4,607 | 92 |
| 80 | 0.356 | 4,649 | 93 |
| 82 | 0.459 | 4,566 | 95 |
| 84 | 0.607 | 4,529 | 94 |
| 86 | 0.784 | 4,640 | 93 |
| 88 | 0.918 | 4,756 | 93 |
| 90 | 1.000 | 4,806 | 92 |
| 92 | 0.989 | 4,850 | 92 |
| 94 | 0.898 | 4,910 | 92 |
| 96 | 0.718 | 4,845 | 91 |
| 98 | 0.567 | 4,823 | 91 |
| 100 | 0.414 | 4,682 | 92 |
| 110 | 0.114 | 4,436 | 93 |
| 120 | 0.038 | 4,379 | 93 |
| 130 | 0.010 | 4,774 | 91 |
| 140 | 0.005 | 4,904 | 90 |
| 150 | 0.005 | 4,683 | 92 |
| 160 | 0.002 | 4,837 | 92 |
| 170 | 0.001 | 4,570 | 94 |
| 180 | – | – | – |

| $\Delta$CCT= | 381 K | |
|---|---|---|
| HALF POWER ANGLE= | 16 ° | |

FIG.32

| ANGLE | LUMINANCE RATIO | COLOR TEMPERATURE | Ra |
|---|---|---|---|
| 0 | - | - | - |
| 10 | - | - | - |
| 20 | 0.462 | 5,213 | 93 |
| 30 | 0.602 | 5,054 | 93 |
| 40 | 0.717 | 4,949 | 92 |
| 50 | 0.816 | 4,867 | 92 |
| 60 | 0.895 | 4,820 | 92 |
| 70 | 0.956 | 4,799 | 92 |
| 80 | 0.989 | 4,765 | 91 |
| 82 | 0.994 | 4,755 | 91 |
| 84 | 0.995 | 4,750 | 91 |
| 86 | 1.000 | 4,747 | 91 |
| 88 | 1.000 | 4,743 | 91 |
| 90 | 1.000 | 4,748 | 91 |
| 92 | 0.999 | 4,755 | 91 |
| 94 | 0.997 | 4,743 | 91 |
| 96 | 0.995 | 4,739 | 91 |
| 98 | 0.991 | 4,739 | 91 |
| 100 | 0.987 | 4,738 | 91 |
| 110 | 0.946 | 4,724 | 91 |
| 120 | 0.883 | 4,737 | 91 |
| 130 | 0.801 | 4,821 | 92 |
| 140 | 0.693 | 4,939 | 92 |
| 150 | 0.574 | 5,113 | 93 |
| 160 | 0.433 | 5,313 | 93 |
| 170 | - | - | - |
| 180 | - | - | - |

| ⊿CCT= | 494 K | |
|---|---|---|
| HALF POWER ANGLE= | 133 ° | |

FIG.33

| ANGLE | LUMINANCE RATIO | COLOR TEMPERATURE | Ra |
|---|---|---|---|
| 0 | – | – | – |
| 10 | 0.002 | 4,935 | 94 |
| 20 | 0.004 | 4,949 | 93 |
| 30 | 0.007 | 4,572 | 94 |
| 40 | 0.005 | 4,709 | 93 |
| 50 | 0.008 | 5,167 | 93 |
| 60 | 0.014 | 4,825 | 93 |
| 70 | 0.118 | 4,853 | 93 |
| 80 | 0.324 | 3,725 | 90 |
| 82 | 0.423 | 4,027 | 90 |
| 84 | 0.520 | 4,314 | 91 |
| 86 | 0.623 | 4,576 | 91 |
| 88 | 0.710 | 4,799 | 92 |
| 90 | 0.803 | 4,943 | 92 |
| 92 | 0.902 | 5,002 | 92 |
| 94 | 0.994 | 5,075 | 92 |
| 96 | 0.994 | 5,077 | 92 |
| 98 | 1.000 | 5,084 | 92 |
| 100 | 0.985 | 5,057 | 93 |
| 110 | 0.588 | 4,655 | 92 |
| 120 | 0.086 | 4,135 | 93 |
| 130 | 0.015 | 4,826 | 93 |
| 140 | 0.005 | 5,248 | 93 |
| 150 | 0.006 | 4,648 | 93 |
| 160 | 0.003 | 4,878 | 93 |
| 170 | 0.002 | 4,678 | 94 |
| 180 | – | – | – |

| | | |
|---|---|---|
| $\Delta$CCT= | 829 | K |
| HALF POWER ANGLE= | 28 | ° |

LIGHT-EMITTING DEVICE AND MANUFACTURING METHOD THEREOF

BACKGROUND OF THE INVENTION

1. Field of the Invention

The present invention relates to a light-emitting device emitting white light, which is used as, for example, an illumination light source, a light source of a backlight of a liquid crystal display, and relates to a manufacturing method thereof.

2. Description of the Related Art

In recent years, a light-emitting device has been developed which emits white light having a wide emission wavelength interval by combining a light-emitting element which emits ultraviolet light or blue light and phosphors which absorb the light from the light-emitting element and wavelength-convert the absorbed light to emit long-wavelength light. Such a light-emitting device is used as, for example, an illumination light source, a light source of a backlight of a liquid crystal display, and the like. In the application to an illumination light source and a light source of a backlight of a liquid crystal display, there is a demand for white light with low chromaticity unevenness and a high color rendering property.

Conventionally, there has been disclosed a light-emitting device realizing a higher color rendering property by a structure in which two kinds or more of phosphors performing different kinds of wavelength conversion are disposed on a light-emitting element emitting blue light, and the light from the light-emitting element and lights wavelength-converted by the phosphors are mixed (see, Japanese Patent Application Laid-open No. 2001-127346).

FIG. 14 is a view showing the structure of a map light 101 provided in an automobile and including a light-emitting device 100 described in the aforesaid Japanese Patent Application Laid-open No. 2001-127346. A general requirement for the map light 101 used in an automobile is to realize brightness equivalent to 30 lux illuminance or more in a light circle with a 30 cm to 40 cm diameter formed on a map or the like as an object to be illuminated 105 which is, for example, 60 cm apart from the light-emitting device 100. In order to thus realize especially high brightness in a predetermined range in a case where the light-emitting device 100 is used for the map light 101 or the like, light from the light-emitting device 100 is gathered by an optical lens 102.

SUMMARY OF THE INVENTION

However, in a case where the light-emitting device 100 described in the aforesaid Japanese Patent Application Laid-open No. 2001-127346 is used, since the phosphors are mixed in transparent resin to cover the light-emitting element, the phosphors cannot be thinly and uniformly disposed around the light-emitting element 5 due to surface tension of the mixed solution, and the phosphors settle in the mixed solution in a curing process of the resin. Due to the influence of these, tone unevenness is not fully solved, resulting in increased tone unevenness of the light gathered by the optical lens 102. Further, the use of an optical element such as a lens for gathering and scattering light results in increased tone unevenness of light having passed through the optical element because blue light emitted by the light-emitting element has directivity. Therefore, it is necessary to reduce the tone unevenness and the directivity by diffusing the gathered light by a light diffuser 103 provided between the optical lens 102 and the object to be illuminated 105, as shown in FIG. 14. The use of the light diffuser 103 causes a great decrease (about ⅓) in emission efficiency of the light-emitting device 100 since the light is attenuated when passing through the light diffuser 103. Therefore, in various applications such as, for example, the map light 101, the plural light-emitting devices 100 have to be used to improve luminance, as shown in FIG. 14. Consequently, equipment space and equipment cost are increased and in addition, there occurs color unevenness in the gathered light because the distribution by the light diffuser is not uniform, which has made it difficult to form a light-emitting element with uniform color temperature.

The present invention was made in view of the above-described problems, and its object is to provide a light-emitting device realizing higher emission efficiency than has been conventionally realized, by reducing tone unevenness of emitted light even without using a light diffuser and realizing decreased equipment space and equipment cost, and to provide a manufacturing method thereof.

To solve the above problems, according to the present invention, there is provided a light-emitting device including: a light-emitting element whose main emission wavelength is 410 nm or less; and one phosphor layer or more stacked on a light-emitting surface of the light-emitting element and containing phosphors that absorb light from the light-emitting element and wavelength-convert the absorbed light to emit light, wherein a difference between a maximum thickness and a minimum thickness of the phosphor layer is equal to or less than two times an average particle size of the phosphors, and an occupancy ratio of the phosphors in the phosphor layer is 50% or more.

In the above light-emitting device, the phosphor layer may be composed of a plurality of phosphor layers containing different phosphors, and the difference between the maximum thickness and the minimum thickness of the phosphor layer closest to the light-emitting element, among the plural phosphor layers, may be equal to or less than two times the average particle size of the phosphors contained in the phosphor layer closest to the light-emitting element.

In the above light-emitting device, a thickness of the phosphor layer may be equal to or less than five times the average particle size of the phosphors.

In the above light-emitting device, the phosphor layer may be composed of one or more stacked phosphor forming layers in which the phosphors are disposed on an adhesive whose thickness is equal to or less than the average particle size of the phosphors.

In the above light-emitting device, the occupancy ratio in the phosphor forming layer farthest from the light-emitting element, among the one or more phosphor forming layers, may be 50% or less.

In the above light-emitting device, the phosphors may have an adjusted particle size.

In the above light-emitting device, the phosphor layer may be stacked in two layers or more on the light-emitting surface of the light-emitting element, and a main emission wavelength of the phosphors contained in the phosphor layer on a side closer to the light-emitting element may be different from a main absorption wavelength of the phosphors contained in the phosphor layer on a side farther from the light-emitting element.

According to another aspect of the present invention, there is provided a manufacturing method of a light-emitting device including: a light-emitting element whose main emission wavelength is 410 nm or less; and a phosphor layer containing phosphors that absorb light from the light-emitting element and wavelength-convert the absorbed light to emit light, the method including: stacking, on a light-emitting surface of the light-emitting element, the phosphor layer in one or more layers while setting a difference between a maximum thickness and a minimum thickness of the phosphor layer equal to or less than two times an average particle size of the phosphors and setting an occupancy ratio of the phosphors in the phosphor layer to 50% or more.

In the above manufacturing method of the light-emitting device, the phosphor layer may be formed to have a thickness that is equal to or less than five times the average particle size of the phosphors.

In the above manufacturing method of the light-emitting device, in forming the phosphor layer, a step of forming a phosphor forming layer may be performed once or a plurality of times to form the phosphor layer, the step of forming the phosphor forming layer being a step in which an adhesive with a thickness equal to or less than the average particle size of the phosphors is applied on the light-emitting element and thereafter the phosphors are disposed on the applied adhesive to form the phosphor forming layer.

In the above manufacturing method of the light-emitting device, in applying the adhesive, viscosity of the adhesive may be lowered.

In the above manufacturing method of the light-emitting device, in stacking the one or more phosphor layers, a main emission wavelength of the phosphors contained in the phosphor layer on a side closer to the light-emitting element may be set different from a main absorption wavelength of the phosphors contained in the phosphor layer on a side farther from the light-emitting element.

In the above manufacturing method of the light-emitting device, in disposing the phosphors, a particle size of the phosphors to be disposed may be adjusted.

According to the present invention, the use of the light-emitting element whose main emission wavelength is equal to or less than 410 nm not falling within a visible spectrum makes it possible to lower directivity of visible light emitted by the light-emitting device, and fixing the phosphor layer to the adhesive whose thickness is equal to or less than the average particle size of the phosphors makes it possible to uniformly distribute the phosphors in the phosphor layer, enabling further reduction in tone unevenness.

BRIEF DESCRIPTION OF THE DRAWINGS

FIG. 10 is an explanatory view showing the procedure for stacking a phosphor forming layer 10b on a phosphor forming layer 10a;

FIG. 11 is an explanatory view showing the procedure for stacking the phosphor forming layer 10b on the phosphor forming layer 10a;

FIG. 12 is an explanatory view showing the procedure for stacking the phosphor forming layer 10b on the phosphor forming layer 10a;

FIG. 17 shows the measurement results (without a lens) in FIG. 15;

FIG. 18 shows the measurement results (with a lens) in FIG. 16;

FIG. 22 shows the measurement results (without a lens) in FIG. 20;

FIG. 23 shows the measurement results (with a lens) in FIG. 21;

FIG. 27 shows the measurement results (without a lens) in FIG. 25;

FIG. 28 shows the measurement results (with a lens) in FIG. 26;

FIG. 32 shows the measurement results (without a lens) in FIG. 30; and

FIG. 33 shows the measurement results (with a lens) in FIG. 31.

DETAILED DESCRIPTION OF THE INVENTION

Figure 1:
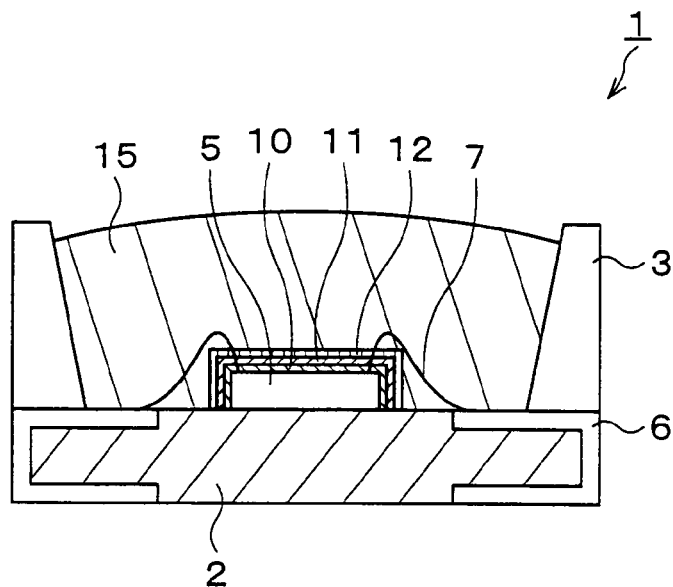
FIG. 1 is a view showing the whole structure of a light-emitting device 1 according to a first embodiment of the present invention.

Hereinafter, a preferred embodiment of the present invention will be described with reference to the drawings. In the specification and the drawings, the same reference numerals and symbols are used to designate substantially the same constituent elements, and redundant description thereof will be omitted.

Figure 2:
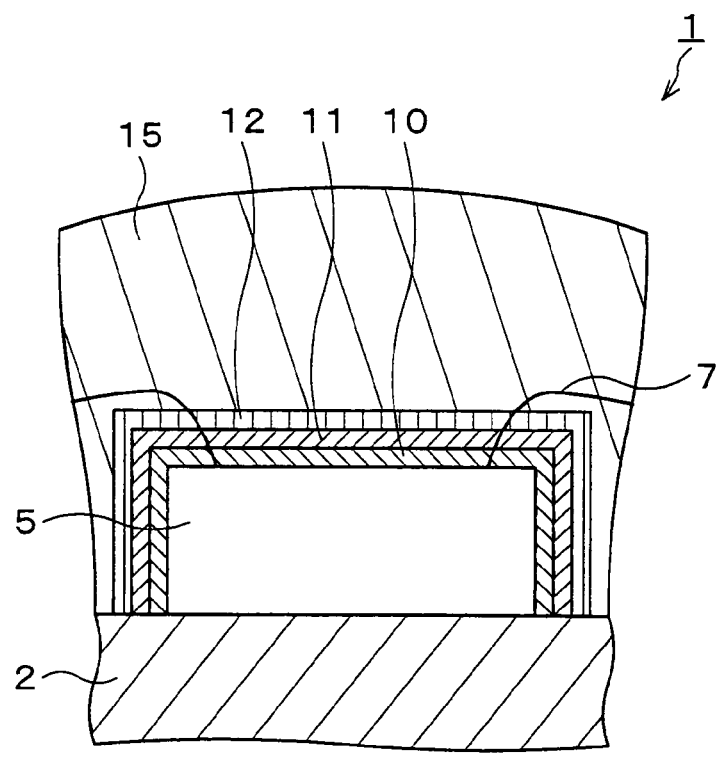
FIG. 2 is an enlarged view showing, in an enlarged manner, a light-emitting element 5 included in the light-emitting device 1 shown in FIG. 1.
Figure 3:
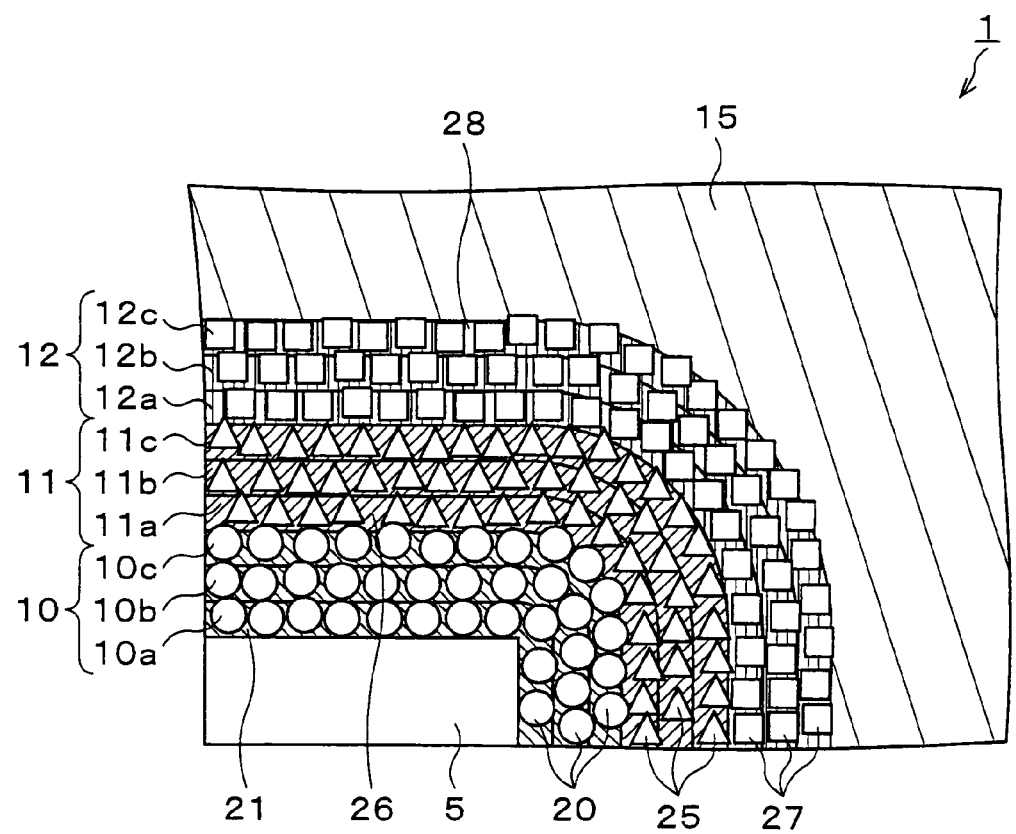
FIG. 3 is an enlarged view showing, in an enlarged manner, phosphor layers 10 to 12 formed on the light-emitting element 5 shown in FIG. 2.

FIG. 1 is a view showing the whole structure of a light-emitting device 1 according to a first embodiment of the present invention. FIG. 2 is an enlarged view showing, in an enlarged manner, a light-emitting element 5 included in the light-emitting device 1 shown in FIG. 1. FIG. 3 is an enlarged view showing, in an enlarged manner, a phosphor layer 10, a phosphor layer 11, and a phosphor layer 12 formed on the light-emitting element 5 shown in FIG. 2.

As shown in FIG. 1, the light-emitting device 1 according to the embodiment of the present invention has a structure in which, for example, a LED emitting ultraviolet light whose main emission wavelength is 410 nm or less is mounted as the light-emitting element 5 on a substrate 2 in a flat plate shape. The light-emitting element 5 is formed in a dice shape with 1 mm×1 mm and 150 μm height. A sidewall 3 formed in a ring shape so as to surround the periphery of the light-emitting element 5 is provided on the substrate 2. External electrodes 6 supplied with power from an external power source (not shown) are provided on the substrate 2. The external electrodes 6 are connected to the light-emitting element 5 via lead wires 7. In this embodiment, the light-emitting element 5 emits light whose main emission wavelength is 400 nm to 405 nm and whose optical power is 300 mW to 350 mW, when supplied with power of 350 mA direct current from the external electrodes 6.

As shown in FIG. 1 and FIG. 2, three kinds of phosphor layers 10, 11, 12 each having a thickness of, for example, not less than a 20 μm nor more than 50 μm are provided in sequence on the light-emitting element 5 so as to cover an upper surface and side surfaces, which are light-emitting surfaces, of the light-emitting element 5. The term "light-emitting surfaces" means light exit surfaces of the light-emitting element 5 which serve as light sources radiating light to an area around the light-emitting device 1, and in the case of the light-emitting element 5 shown in FIG. 1, since the light-emitting element 5 is disposed on the substrate 2, the upper surface and the side surfaces except a bottom surface are the light-emitting surfaces. The expression "cover the light-emitting surfaces" of the light-emitting element 5 by using the phosphor layer 10 and so on is used to mean "intercept an optical path of light emitted by the light-emitting element 5, and in this case, since the light-emitting element 5 is disposed on the substrate 2, the upper surface and the side surfaces except the bottom surface of the light-emitting element 5 are the light-emitting surfaces. In this embodiment, the phosphor layers 10, 11, 12 are stacked in one layer or more directly on the light-emitting surfaces of the light-emitting element 5 to cover the light-emitting surfaces of the light-emitting element 5.

A sealing member 15 such as, for example, transparent resin is filled from above the phosphor layers 10, 11, 12 into a recessed portion formed by the sidewall 3 formed in the ring shape and the substrate 2 to confine the light-emitting element 5. As shown in FIG. 3, the phosphor layer 10 is composed of three phosphor forming layers 10a to 10c which are stacked in this order from the bottom on the light-emitting element 5. The phosphor layer 11 is composed of three phosphor forming layers 11a to 11c which are stacked in this order from the bottom on the phosphor layer 10 (that is, the phosphor forming layer 10c). The phosphor layer 12 is composed of three phosphor forming layers 12a to 12c which are stacked in this order from the bottom on the phosphor layer 11 (that is, the phosphor forming layer 11c).

Here, a difference between the maximum thickness and the minimum thickness of the phosphor layer 10 is set equal to or less than two times an average particle size of phosphors 20 contained in the phosphor layer 10. Likewise, a difference between the maximum thickness and the minimum thickness of the phosphor layer 11 is set equal to or less than two times an average particle size of phosphors 25 contained in the phosphor layer 11, and a difference between the maximum thickness and the minimum thickness of the phosphor layer 12 is set equal to or less than two times an average particle size of phosphors 27 contained in the phosphor layer 12. In this specification, the average particle sizes of the phosphors 20, 25, 27 are measured in the following manner. The phosphor layer of the light-emitting device 1 is cut, its cross section is photographed by a scanning electron microscope (SEM), the longest diameter value of each particle of the phosphors 20, 25, or 27 is measured based on an obtained SEM photograph, and an average diameter value of the particles whose longest diameter values are 1 μm or more is calculated.

The phosphor forming layer 10a is formed such that the phosphors 20 whose average particle size is, for example, 7 μm are fixed to an adhesive 21 applied to, for example, a 5 μm thickness smaller than the average particle size of the phosphors 20. An occupancy ratio of the phosphors 20 in the phosphor forming layer 10a is set to 60% or more. Here, the term "occupancy ratio" will be explained. The term "occupancy ratio" used in this specification means a ratio of an area occupied by phosphors included in a cross section of a cut phosphor layer or phosphor forming layer of the light-emitting device 1 relative to the total area of the cross section. In measuring an occupancy ratio of phosphors in a phosphor layer or a phosphor forming layer, the occupancy ratio is calculated based on a photograph of the cut light-emitting device 1, as in measuring the average particle size of phosphors described above. The higher a ratio of a volume of the phosphors to the total volume of the phosphor layer (that is, a filling factor) is, the higher the calculated occupancy ratio of the phosphor layer is.

The phosphor forming layers 10b, 10c have the same structure as that of the phosphor forming layer 10a. Since the filling factors of the phosphors 20 contained in the phosphor forming layers 10a to 10c are high, that is, since the occupancy ratios of the phosphors in the cross sections of the phosphor forming layers 10a to 10c are all set to 60% or more, the occupancy ratio of the phosphors 20 in the phosphor layer 10 is 60% or more. Similarly to the phosphor forming layer 10a, the phosphor forming layer 11a is formed such that the phosphors 25, of a different type from the phosphors 20, whose average particle size is, for example, 10 μm are fixed to an adhesive 26 applied to, for example, a 5 μm thickness smaller than the average particle size of the phosphors 25. The phosphor forming layers 11b, 11c are formed in the same manner as the phosphor forming layer 11a. Since the occupancy ratios of the phosphors 25 in the phosphor forming layers 11a to 11c are all set to 60% or more, the occupancy ratio of the phosphors 25 in the phosphor layer 11 is 60% or more. Similarly to the phosphor forming layers 10a, 11a, the phosphor forming layer 12a is formed such that the phosphors 27, of a different type from the phosphors 20, 25, whose average particle size is, for example, 18 μm are fixed to an adhesive 28 applied to, for example, a 5 μm thickness smaller than the average particle size of the phosphors 27. The phosphor forming layers 12b, 12c are formed in the same manner as the phosphor forming layer 12a. Since the occupancy ratios of the phosphors 27 in the phosphor forming layers 12a to 12c are all set to 60% or more, the occupancy ratio of the phosphors 27 in the phosphor layer 12 is 60% or more.

In this embodiment, as the phosphors 20, used are phosphors which have a 7 μm average particle size and are expressed as $CaAlSiN_3$:Eu, and which absorb ultraviolet light emitted by the light-emitting element 5 and wavelength-convert the absorbed light to emit red light whose main emission wavelength is 659 nm. As the phosphors 25, used are phosphors which have a 10 μm average particle size and are expressed as $SrAl_{1+x}Si_{4-x}O_xN_{7-x}$:Ce, and which absorb ultraviolet light emitted by the light-emitting element 5 and wavelength-convert the absorbed light to emit green light whose main emission wavelength is 557 nm. As the phosphors 27, used are phosphors which have an 18 μm average particle size and are expressed as $SrAl_xSi_{6-x}O_{1+x}N_{8-x}$:Eu, and which absorb ultraviolet light emitted by the light-emitting element 5 and wavelength-convert the absorbed light to emit blue light whose main emission wavelength is 451 nm.

In this embodiment, when two kinds or more of the phosphors (three kinds of the phosphors 20, 25, 27 in this embodiment) are disposed, the main emission wavelength of the phosphors contained in the phosphor layer on a side closer to the light-emitting element 5 (that is, on an inner side) is set longer than the main absorption wavelength of the phosphors contained in the phosphor layer on a side farther from the light-emitting element 5 (that is, on an outer side). In this specification, the main wavelength of light absorbed by the phosphors at the time of the wavelength conversion is called "main absorption wavelength", and the main wavelength of light that the phosphors emit after wavelength-converting the absorbed light is called "main emission wavelength".

Concretely, as for the phosphor layer 10 disposed on a side closer to the light-emitting element 5 than the phosphor layers 11, 12, the main emission wavelength of the phosphors 20 contained in the phosphor layer 10 is different from the main absorption wavelengths of the phosphors 25, 27 contained in the phosphor layers 11, 12 disposed on a side farther from the light-emitting element 5 than the phosphor layer 10. As for the relation between the phosphor layer 11 and the phosphor layer 12, the main emission wavelength of the phosphors 25 contained in the phosphor layer 11 disposed on a side closer to the light-emitting element 5 than the phosphor layer 12 is different from the main absorption wavelength of the phosphors 27 contained in the phosphor layer 12 disposed on a side farther from the light-emitting element 5 than the phosphor layer 11.

In the above-described arrangement and structure of the phosphor layers 10 to 12, red light emitted by the phosphors 20 of the phosphor layer 10 relatively closer to the light-emitting element 5 is in a different main wavelength range (energy range) from a main wavelength range that the phosphors 25, 27 of the phosphor layers 11, 12 relatively farther from the light-emitting element 5 absorb in order to emit green light and blue light respectively, and therefore, the red light from the phosphors 20 on a lower layer has no risk of being absorbed and wavelength-converted by the phosphors 25, 27 on upper layers. Similarly, the green light emitted by the phosphors 25 of the phosphor layer 11 relatively closer to the light-emitting element 5 is in a different main wavelength range (energy range) from a main wavelength range that the phosphors 27 of the phosphor layer 12 relatively farther from the light-emitting element 5 absorb in order to emit blue light, and therefore, the green light from the phosphors 25 on a lower layer has no risk of being absorbed and wavelength-converted by the phosphors 27 on an upper layer. In this manner, the phosphors emitting light with a longer wavelength are disposed on a side closer to the light-emitting element 5 (that is, on an inner side) and the phosphors absorbing light with a shorter wavelength are disposed on a side farther from the light-emitting element 5 (that is, on an outer side), which makes it possible to prevent a decrease in emission power caused by repeated wavelength conversion by two kinds or more of the phosphors 20, 25, 27, and to easily adjust color temperature of light emitted by the light-emitting device when the plural phosphor layers are formed.

Figure 4:
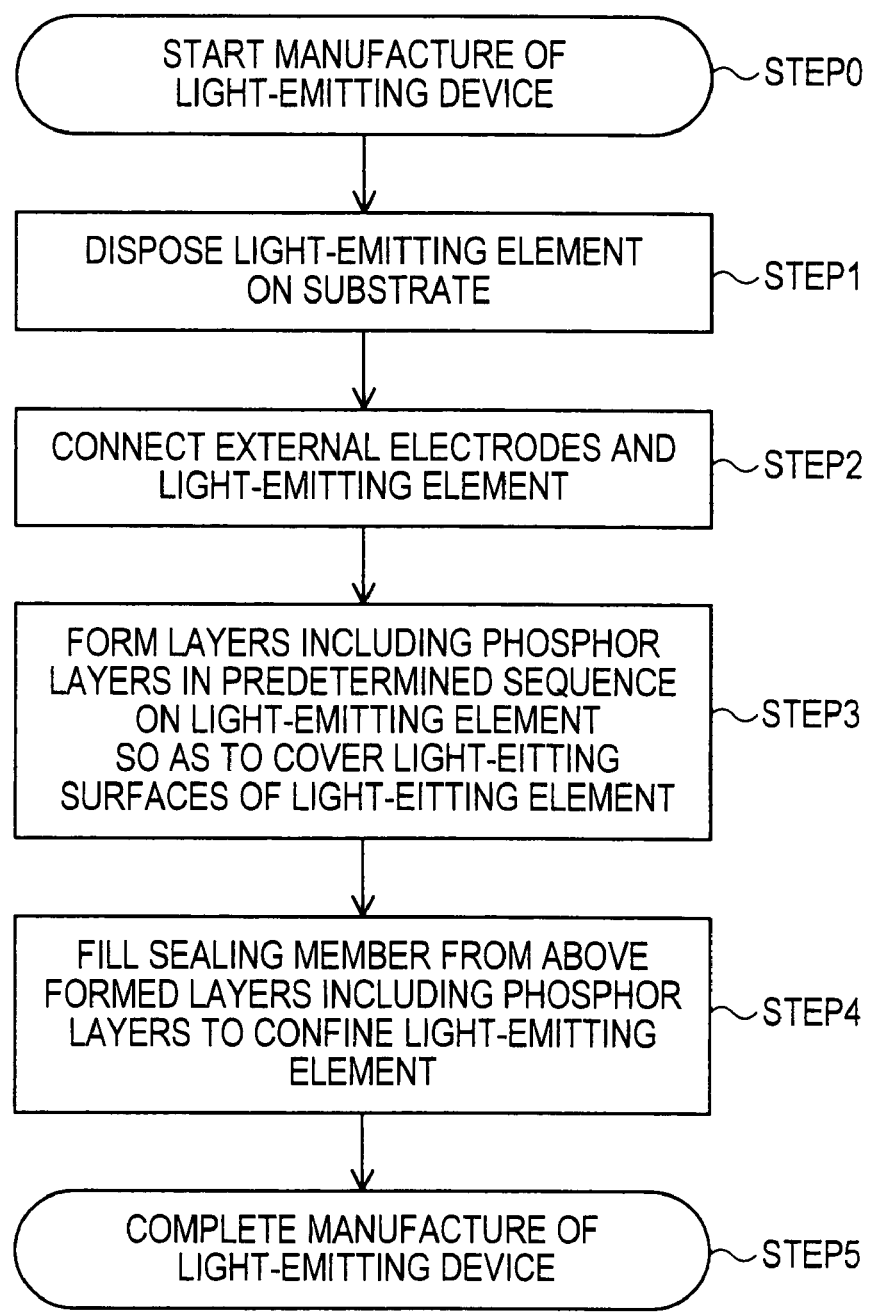
FIG. 4 is a flowchart showing the whole procedure of a manufacturing method according to an embodiment of the present invention.

Next, a manufacturing method according to an embodiment of the present invention for manufacturing the light-emitting device 1 as structured above will be described by using FIG. 4. FIG. 4 is a flowchart showing the whole procedure of the manufacturing method according to the embodiment of the present invention.

As shown in FIG. 4, at the start of the manufacture of the light-emitting device 1 (Step 0), the light-emitting element 5 is first disposed on the substrate 2 by using, for example, solder or conductive paste (Step 1). Next, the lead wires 7 are connected to the light-emitting element 5 and the external electrodes 6 by using, for example, an ultrasonic bonding method or a pressure bonding method (Step 2). Thereafter, layers including the phosphor layers 10, 11, 12 are formed in a predetermined sequence on the light-emitting element 5 so as to cover the light-emitting surfaces of the light-emitting element 5 (Step 3). In this embodiment, as shown in FIG. 1, the three different phosphor layers 10, 11, 12 are sequentially formed in stack on the light-emitting element 5. After the formation of the phosphor layers 10, 11, 12 is finished, the sealing member 15 such as, for example, transparent resin is filled from above the phosphor layer 12 into the recessed portion formed by the sidewall 3 formed in the ring shape and the substrate 2 to confine the light-emitting element 5 together with the phosphor layers 10, 11, 12 (Step 4). Through Step 0 to Step 4 described above, the manufacture of the light-emitting device 1 is completed (Step 5).

Figure 5:
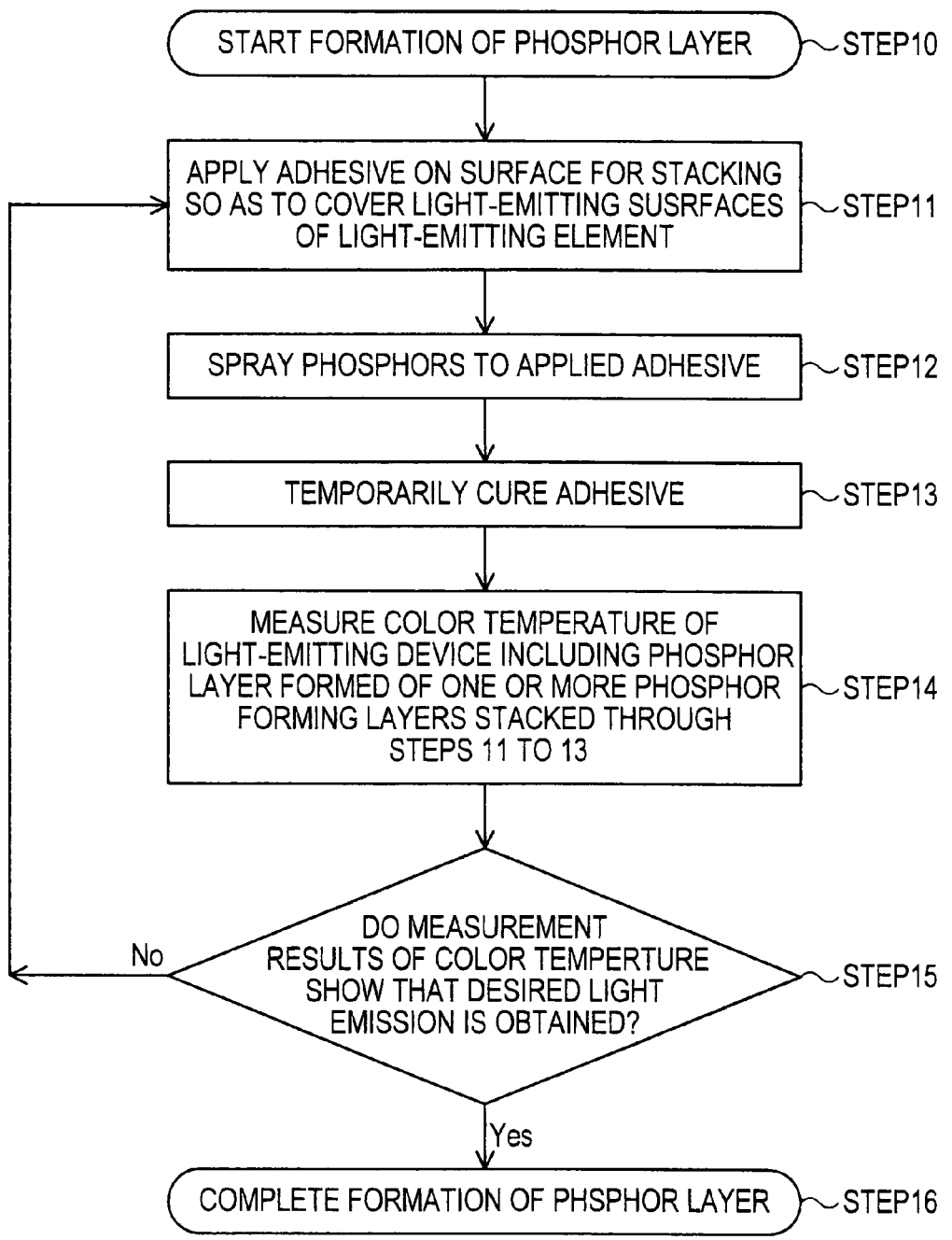
FIG. 5 is a flowchart showing the procedure at Step 3 in FIG. 4.

The following will describe in detail the procedure for forming the phosphor layers 10, 11, 12 in forming the various layers at Step 3. In this embodiment, the three phosphor layers 10, 11, 12 are formed in sequence on the light-emitting surfaces of the light-emitting element 5. FIG. 5 is a flowchart showing the procedure for forming the phosphor layers 10, 11, 12 at Step 3. In the following description, the phosphor layer 10 formed directly on the light-emitting element 5 will be taken as an example.

Figure 6:
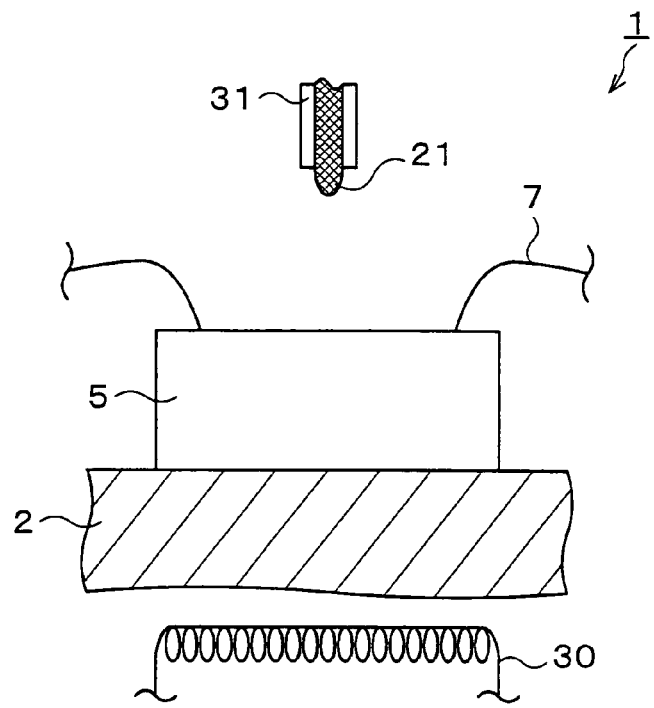
FIG. 6 is an explanatory view showing the procedure for applying an adhesive 21 on the light-emitting element 5 at Step 11 in FIG. 5.
Figure 7:
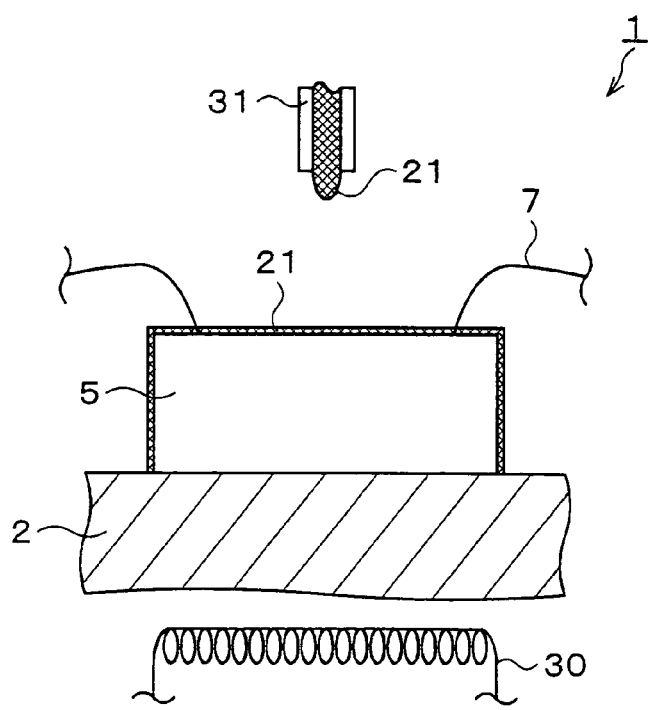
FIG. 7 is an explanatory view showing a state after the adhesive 21 is applied on the light-emitting element 5 in the procedure at Step 11 in FIG. 5.

When the formation of the phosphor layer 10 is started (Step 10), the adhesive 21 such as, for example, silicon or epoxy is applied on the light-emitting element 5, which is a surface for stacking, by, for example, a dispense method or a spray method (Step 11). FIG. 6 and FIG. 7 are explanatory views showing the procedure for applying the adhesive 21 on the light-emitting element 5 by the dispense method at Step 10.

At the time of the application of the adhesive 21, the upper surface and the side surfaces as the light-emitting surfaces of the light-emitting element 5 on which the adhesive 21 is to be applied are heated by a heater 30 disposed under the light-emitting element 5 and the substrate 2, as shown in FIG. 6. The adhesive 21 discharged from a needle-shaped discharge port 31 is heated on thus heated light-emitting surfaces to decrease in viscosity, and is distributed on the light-emitting surfaces of the light-emitting element 5 to have a uniform thickness owing to a reduced influence of surface tension, as shown in FIG. 7. Consequently, thickness variation of the adhesive 21 is prevented because the adhesive 21 does not rise on the light-emitting surfaces of the light-emitting element 5 due to surface tension. As a result, the thickness of the adhesive 21 applied on the surface for stacking becomes equal to or less than the average particle size of the phosphors 20 sprayed to the adhesive 21 at Step 12 which will be described later.

Figure 8:
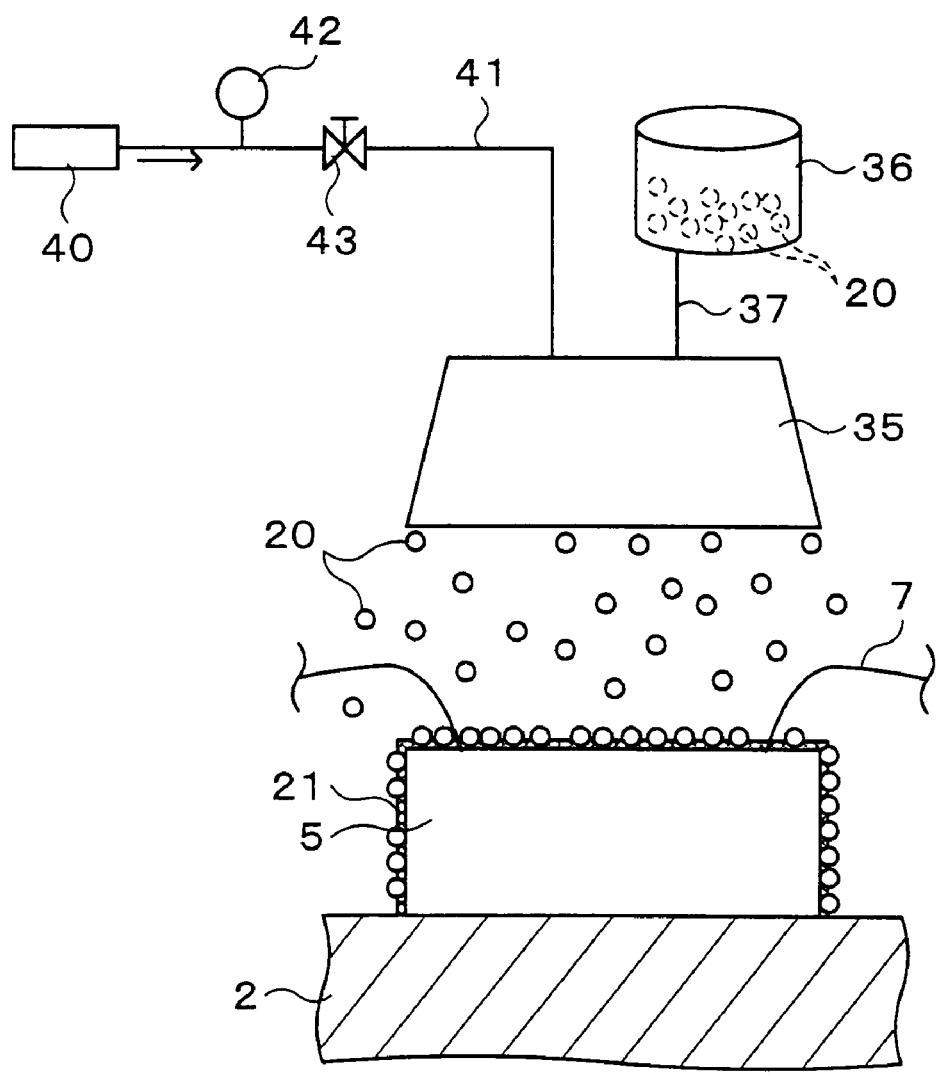
FIG. 8 is an explanatory view showing the procedure for spraying phosphors 20 to the applied adhesive 21 in a case where compressed gas is used, as an example.

While the adhesive 21 applied on the light-emitting surfaces of the light-emitting element 5 at Step 11 is kept viscous, the phosphors 20 are sprayed to the applied adhesive 21 (Step 12) to be disposed on the whole light-emitting surfaces of the light-emitting element 5. FIG. 8 is an explanatory view showing the procedure for spraying the phosphors 20 to the applied adhesive 21 in a case where compressed gas is used, as an example.

As shown in FIG. 8, a nozzle 35 spraying the phosphors 20 is disposed at an upper position facing the light-emitting surfaces of the light-emitting element 5. A cartridge 36 supplying the phosphors 20 to be sprayed is connected to the nozzle 35 via a pipe 37. A storage part 40 storing the compressed gas such as, for example, air, nitrogen, or argon is further connected to the nozzle 35 via a pipe 41. A pressure adjusting device 42 and an opening/closing valve 43 which adjust a flow rate and the like of the compressed gas sent from the storage part 40 are attached to the pipe 41. With this structure, the phosphors 20 supplied from the cartridge 36 are ejected from the nozzle 35 with the assist of the compressed gas whose ejection amount has been adjusted by the pressure adjusting device 42 and the opening/closing valve 43, and the phosphors 20 are sprayed to the adhesive 21 applied on the light-emitting surfaces of the light-emitting element 5.

In this embodiment, a sieve (not shown) is provided in the nozzle 35, so that only the phosphors 20 whose particle size is equal to or less than a predetermined value can be ejected from the nozzle 35. In this manner, the particle size of the phosphors 20 sprayed to the applied adhesive 21 from the nozzle 35 is adjusted.

The adhesive 21 on which the phosphors 20 are disposed is heated, for example, at 200° C. for one minute and is temporarily cured (Step 13). Through the procedure of Steps 11 to 13 described above, the phosphor forming layer 10a is formed on the light-emitting surfaces of the light-emitting element 5.

Figure 9:
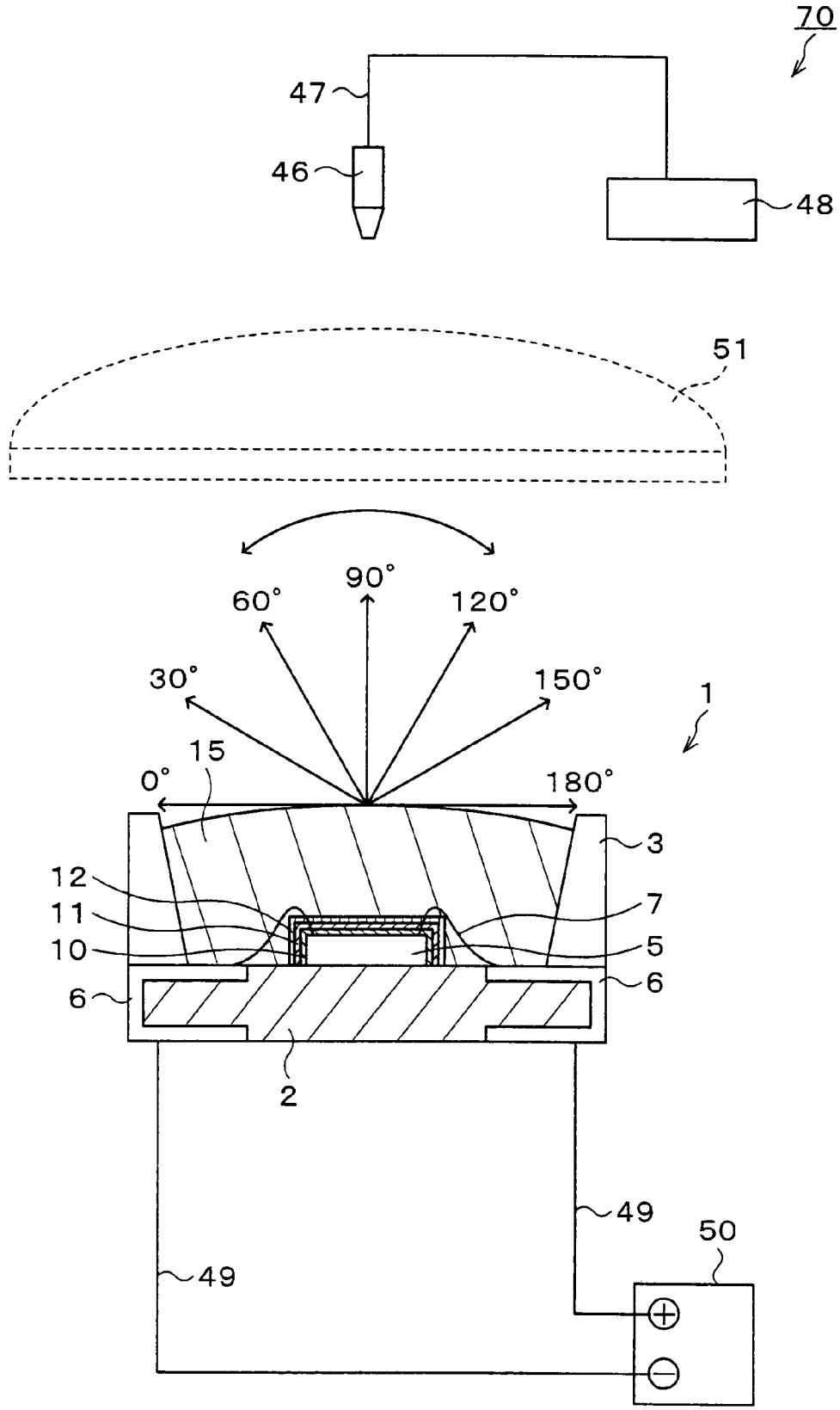
FIG. 9 is a view showing the structure of a tone unevenness measuring device 70 measuring tone unevenness of the light-emitting device.

In order to determine whether or not desired light emission is obtained from the phosphor forming layer 10a formed on the light-emitting surfaces of the light-emitting element 5, color temperature of the light-emitting device 1 is measured (Step 14). FIG. 9 is an explanatory view showing a tone unevenness measuring device 70, as an example of a method of measuring the color temperature of the light-emitting device 1. As shown in FIG. 9, a detector 46 detecting light is disposed at a position facing the light-emitting device 1. In this embodiment, the distance between the light-emitting device 1 and the detector 46 is set to 1.5 m. The detector 46 is connected to a spectroscope 48 via an optical fiber 47. The external electrodes 6 of the light-emitting device 1 as an object to be measured are connected to positive and negative electrodes of a power source 50 via wiring lines 49 and are supplied with power, and the measurement is conducted while the light-emitting device 1 is emitting light.

The measurement of the color temperature is conducted while the light-emitting device 1 as an object to be measured is rotated rightward and leftward in the same vertical plane (paper surface of FIG. 9) from the position shown in FIG. 9. As shown in FIG. 9, the position of the light-emitting device 1 when light radiated therefrom in a direction perpendicular to an upper surface of the substrate can be measured is defined as angle 90°. The position of the light-emitting device 1 rotated rightward by 90 degrees is 0°. The position of the light-emitting device 1 rotated leftward by 90 degrees is 180°. Generally, luminance of a light-emitting device is low when the light-emitting device is at the 0° position, and the luminance increases as the position of the light-emitting device gets closer to 90° from 0°, and decreases again as the position gets closer to 180° from 90°.

Light detected by the detector 46 is sent to the spectroscope 48 via the optical fiber 47. The spectroscope 48 spectrum-analyzes the light detected by the detector 46, and luminance and correlated color temperature of the light-emitting device 1 are measured based on the analysis results.

Figure 10:
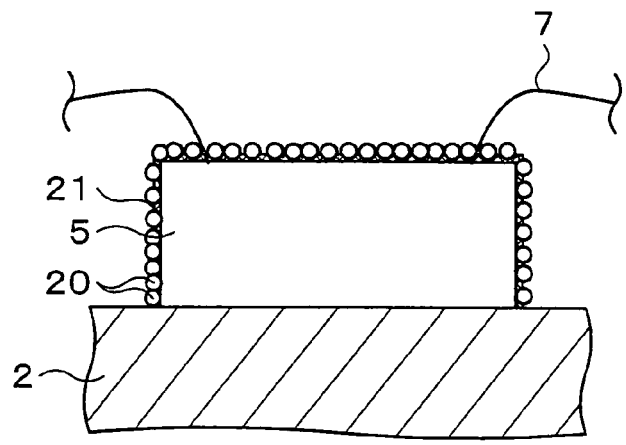
Figure 11:
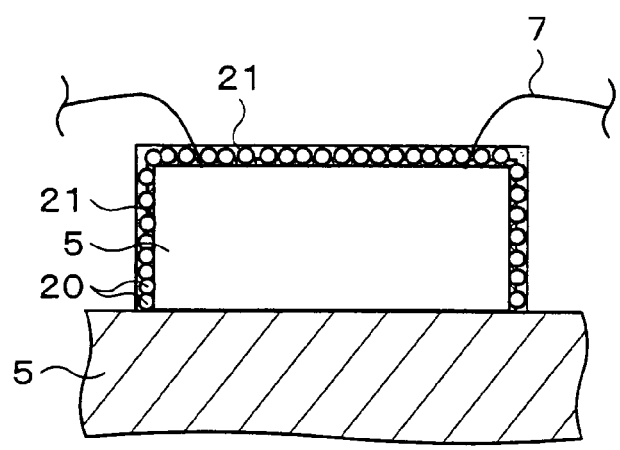
Figure 12:
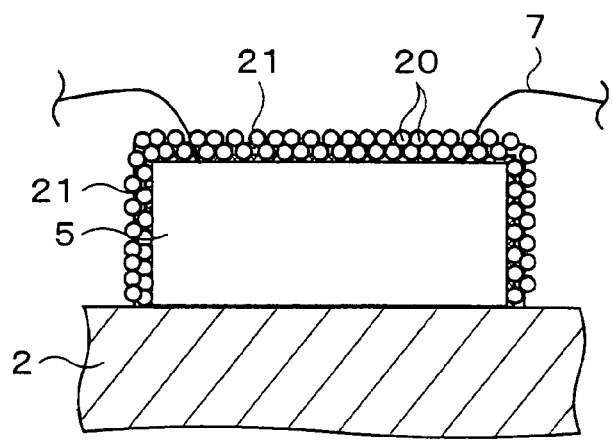

If the measurement results obtained at Step 14 show that the desired light emission is obtained from the light-emitting device 1 on which the phosphor forming layer 10a is formed (Yes at Step 15), the formation of the phosphor layer 10 is completed (Step 16). On the other hand, if the desired light emission is not obtained (No at Step 15), the process returns to Step 11, and Steps 11 to 13 are repeated to stack the new phosphor forming layer 10b. FIG. 10 to FIG. 12 are explanatory views showing the procedure for stacking the new phosphor forming layer 10b. Concretely, the adhesive 21 is applied on the phosphor forming layer 10a as a surface for stacking, which is shown in FIG. 10, formed on the light-emitting surfaces of the light-emitting element 5, as shown in FIG. 11. Then, as shown in FIG. 12, the phosphors 20 are sprayed to and disposed on the adhesive 21 applied on the phosphor forming layer 10a, and thereafter, the adhesive 21 is temporarily cured, whereby the new phosphor forming layer 10b is formed.

In order to determine whether or not the desired light emission is realized in the light-emitting device 1 by the phosphor forming layers 10a, 10b which are stacked as a result of the repetition of Steps 11 to 13, color temperature of the light-emitting device 1 is measured (Step 14). If the measurement results show that the desired light emission is obtained (Yes at Step 15), the formation of the phosphor layer 10 is completed (Step 16). On the other hand, if the desired light emission is not obtained (No at Step 15), the process returns to Step 11, and Steps 11 to 13 are repeated. In the above-described manner, Steps 11 to 15 are repeated as the formation step of forming the phosphor forming layer, thereby stacking the phosphor forming layers 10*a*, 10*b*, . . . until the desired light emission is realized in the light-emitting device 1, and the formation of the phosphor layer 10 is completed (Step 16). In this embodiment, the phosphor layer 10 in which the three phosphor forming layers 10*a* to 10*c* are stacked is formed as shown in FIG. 3, so that the desired light emission is realized by the phosphor layer 10. By thus stacking the phosphor forming layers 10*a* to 10*c*, it is possible to form the phosphor layer 10 with a very small thickness and to set the difference between the maximum thickness and the minimum thickness of the phosphor layer 10 equal to or less than two times the average particle size of the phosphors 20. At this time, an average thickness of the phosphor layer 10 is preferably set equal to or less than five times the average particle size of the phosphors 20 contained therein.

In this embodiment, the occupancy ratios of the phosphors 20 in the phosphor forming layers (10*a*, 10*b*, . . . ) are all set to 60% or more, so that the occupancy ratio of the phosphors 20 in the phosphor layer 10 composed of the phosphor forming layers (10*a*, 10*b*, . . . ) is set to 60% or more. At the time of the adjustment of the color temperature of the light-emitting device 1, by adjusting the occupancy ratio of the phosphors 20 in the phosphor forming layer that is the farthest from the light-emitting element 5 and formed last to 50% or less, it is possible to finely adjust the color temperature. For example, if the phosphor layer 10 is composed of four phosphor forming layers 10*a* to 10*d* (10*d* is not shown), by setting the occupancy ratios of the phosphors 20 in the three phosphor forming layers 10*a* to 10*c* stacked closer to the light-emitting element 5 to 60% or more and setting the occupancy ratio of the phosphors 20 in the phosphor forming layer 10*d* which is formed last on these three layers (10*a* to 10*c*) to 5%, it is possible to change the color temperature in a 100 K unit. At this time, the occupancy ratio of the phosphors 20 in the phosphor layer 10 is about 50%.

As described above, a phosphor layer with a high filling factor of phosphors, that is, with a 50% occupancy ratio or more of the phosphors can be formed, and the phosphor layer with a very small thickness can be formed. Concretely, it is possible to set the color temperature to an aimed value even when the thickness of the phosphor layer is set equal to less than five times the average particle size. Consequently, a difference between the maximum thickness and the minimum thickness of the phosphor layer (thickness variation) can be reduced to a small value. Further, more uniform distribution of the phosphors 20 in the phosphor layer 10 can be realized. In particular, it is more effective if the difference between the maximum thickness and the minimum thickness in the phosphor layer 10 is reduced to a value equal to or less than two times the average particle size of the phosphors 20. Owing to the reduced thickness variation of the phosphor layer and the uniform distribution of the phosphors, lights radiated in respective emission directions from the light-emitting element 5 to the phosphor layer 10 can be uniformly wavelength-converted. Consequently, it is possible to provide the light-emitting device 1 emitting light with reduced tone unevenness and an improved color rendering property, and the manufacturing method thereof.

The above example describes the phosphor layer 10 which is formed in stack directly on the light-emitting surfaces of the light-emitting element 5, but the same procedure is followed for sequentially forming the phosphor layers 11, 12 in stack on the phosphor layer 10 which is a surface for stacking, after the phosphor layer 10 is formed. Further, in this embodiment, the adhesive 26 used when the phosphor layer 11 is formed and the adhesive 28 used when the phosphor layer 12 is formed are the same as the adhesive 21 used when the phosphor layer 10 is formed, but may be different from the adhesive 21.

According to the above-described embodiment, since the light-emitting element 5 whose main emission wavelength is 410 nm or less not falling within the visible spectrum is used, visible light whose tone unevenness is recognized by human eyes, among lights emitted by the light-emitting device 1, is composed only of low-directivity lights that the phosphors 20, 25, 27 in the phosphor layers 10, 11, 12 emit after absorbing and wavelength-converting the light emitted from the light-emitting element 5, and therefore, directivity of the visible light emitted from the light-emitting device can be lowered. The above advantages eliminate a need for adjusting tone unevenness and directivity of light by using a light diffuser as has been necessary when a conventionally known light-emitting device is used, resulting in no attenuation of light ascribable to the light diffuser. In particular, even in a case where tone unevenness becomes prominent because the light from the light-emitting device 1 is used after gathered by a lens, the light diffuser need not be used. Consequently, the light-emitting device can have far higher emission efficiency than a conventional light-emitting device, and desired illuminance can be attained with a smaller number of the light-emitting devices 1 than conventionally needed, enabling a reduction in equipment space and equipment cost.

Since the phosphor layer 10 (the same with the phosphor layers 11, 12, and so on) stacked on the light-emitting surfaces of the light-emitting element 5 is formed of the one or more stacked phosphor forming layers 10*a*, 10*b*, 10*c* in which the phosphors 20 are disposed on the adhesive 21 whose thickness is equal to or less than the average particle size of the phosphors 20, it is possible to uniformly distribute the phosphors 20 in the phosphor layer 10 and to fill the phosphors 20 in the phosphor layer 10 with high density, enabling an effective reduction in tone unevenness.

Further, the present inventors found out that, by stacking the one or more phosphor layers 10, 11, 12 directly on the light-emitting surfaces of the light-emitting element 5, it is possible to reduce the attenuation of the light to increase emission intensity because the distance that ultraviolet light from the light-emitting element 5 passes through the resin is reduced and thus the resin absorbs a less amount of light. In particular, the structure where a thick resin layer does not exist between the light-emitting element and the phosphors can prevent tone unevenness that might occur if an attenuation amount should differ depending on the emission directions of the ultraviolet light due to thickness variation of the resin.

For example, it is possible to prevent tone unevenness which occurs in a case where the phosphors are mixed and dispersed in resin or the like as has been done conventionally, that is, which occurs due to an attenuation difference depending on the emission directions of ultraviolet light ascribable to thickness variation of resin. Specifically, by reducing the distance that ultraviolet light passes through the resin, quickly converting ultraviolet light to visible light less absorbable by the resin, and making the visible light pass through the resin, it is possible to reduce tone unevenness of light emitted from the light-emitting device and also improve emission power. Therefore, when light is gathered by using an optical element, it is not necessary to adjust tone unevenness and directivity of light by using a light diffuser as has been necessary for a conventionally known light-emitting device, and thus no attenuation of light by the light diffuser occurs. Concrete effects obtained are to reduce tone unevenness expressed by chromaticity to about 100 K from conventional 800 K when a half power angle is 40°, to about 150 K from conventional 1000 K when a half power angle is 30°, and further to about 200 K from conventional 1500 K when a half power angle is 20°.

Further, in the arrangement and structure in which the phosphor layers 10, 11, 12 are stacked in two layers or more on the light-emitting surfaces of the light-emitting element 5, since the main emission wavelength of the phosphors contained in the phosphor layer on a side closer to the light-emitting element 5 (that is, on an inner side) is different from the main absorption wavelength of the phosphors contained in the phosphor layer on a side farther from the light-emitting element 5 (that is, on an outer side), each of the phosphor layers does not absorb light of the other phosphor layers and absorbs only light emitted by the light-emitting element 5 to emit light, which makes it possible to very easily adjust color temperature of each of the phosphor layers.

Further, in the process of forming the phosphor layer 10, whether or not desired light emission is obtained is confirmed based on the color temperature of the light-emitting device 1 which is measured every time each of the phosphor forming layers 10a to 10c forming the phosphor layer 10 is formed, and accordingly, the color temperature of the light-emitting device 1 owing to the phosphor layer 10 can be finely adjusted in a 100 K unit. This enables the manufacture of the light-emitting device 1 whose phosphor layer 10 can realize light emission which is closer to desired light emission than in a conventional light-emitting device.

Further, since the particle size of the phosphors 20 contained in the phosphor layer 10 is adjusted to, for example, a predetermined value or less, each of the phosphor forming layers 10a to 10c forming the phosphor layer 10 can have more uniform thickness. Accordingly, thickness variation in the phosphor layer in which the phosphor forming layers are stacked can be reduced to a value equal to or less than two times the average particle size of the contained phosphors, resulting in reduced tone unevenness and improved color rendering property.

Figure 13:
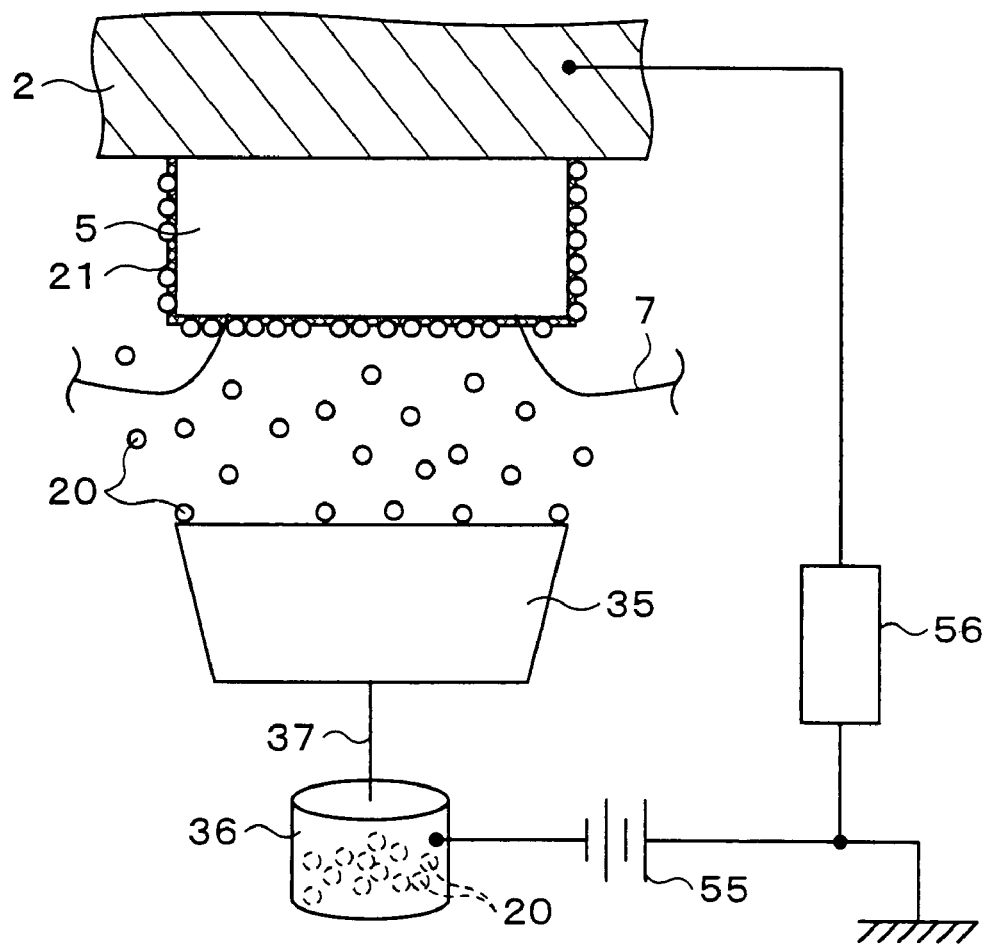
FIG. 13 is an explanatory view showing the procedure for disposing the phosphors 20 on the applied adhesive 21 in a case where electrostatic attraction is used, as an example.
Figure 14:
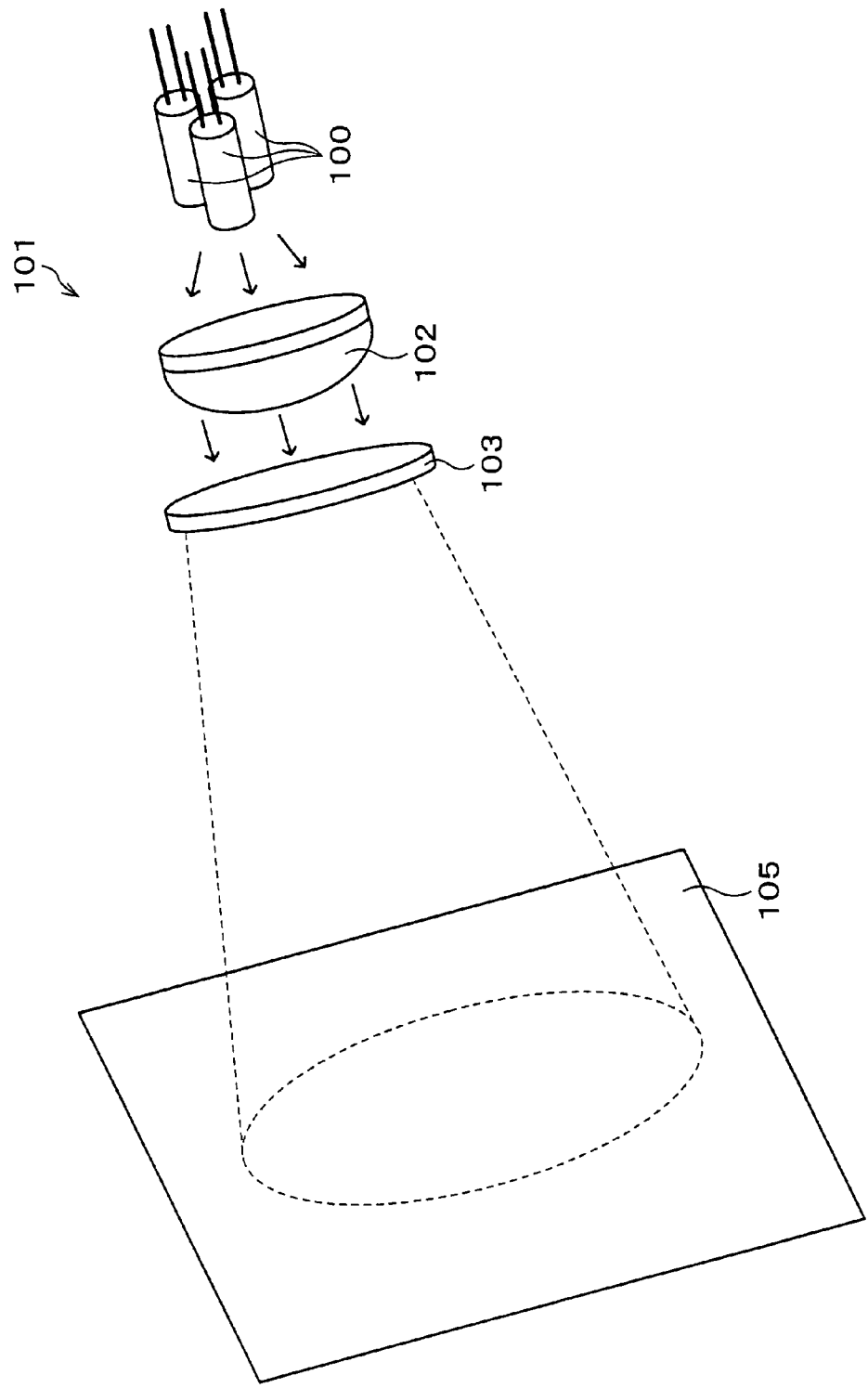
FIG. 14 is a view showing the structure of a map light 101 including a conventionally known light-emitting device 100.

As another example of the first embodiment of the present invention, electrostatic attraction may be used when the phosphors 20 are disposed on the light-emitting surfaces of the light-emitting element 5 on which the adhesive 21 is applied, as shown in FIG. 13. In FIG. 13, both electrodes of a power source 55 capable of applying high voltage are connected to the substrate 2 and the cartridge 36 which supplies the phosphors 20 to the nozzle 35. A voltage pattern applied to the substrate 2 and the cartridge 36 by the power source 55 is controlled by a voltage control device 56 connected to the power source 55. With this structure, the phosphors 20 in the cartridge 36 can be negatively charged to be electrostatically attracted to the adhesive 21 on the positively charged substrate 2 side via the nozzle 35.

Hitherto, the preferred embodiment of the present invention has been described with reference to the appended drawings, but the present invention is not limited to such an example. It is apparent that those skilled in the art could reach various modified examples or corrected examples within the technical idea described in the claims, and it should be naturally understood that these examples also belong to the technical scope of the present invention.

The above embodiment describes the case where the LED emitting ultraviolet light is used as the light-emitting element 5, but as the light-emitting element 5, those emitting light whose main emission wavelength is 410 nm or less may be used other than the LED.

The above embodiment describes the case where the number of the phosphor forming layers forming the phosphor layer 10 is three, but the number of the phosphor forming layers forming the phosphor layer 10 may be any.

The above embodiment describes the case where the phosphors 20 of one kind are contained in the phosphor layer 10, but the phosphor layer 10 may contain phosphors of two kinds or more.

The above embodiment describes the case where the number of the phosphor layers 10, 11, 12 stacked on the light-emitting surfaces of the light-emitting element 5 is three, but the number of the phosphor layers may be any. Further, the above embodiment describes the case where the sealing member 15 is filled from above the phosphor layers 10, 11, 12 to confine the light-emitting element 5, but a conventionally known phosphor layer may be disposed on the phosphor layers. At this time, by using fine particles with a 10 μm particle size or less as phosphors contained in the conventionally known phosphor layer, it is possible to greatly reduce an influence by sedimentation of the phosphors, and the same effects as those of the present invention can be obtained. Alternatively, setting an amount of the phosphors contained in the conventionally known phosphor layer to an extremely small value can provide the same effects.

The above embodiment describes the case where the heater 30 is used to heat the applied adhesive 21 to lower its viscosity, but a heating device other than the heater 30 may be used for heating the adhesive 21 to lower the viscosity. Further, the viscosity may be lowered by a solvent diluting the adhesive 21. Further, the dilution of the adhesive 21 by the solvent and the heating may both be adopted.

The above embodiment describes the case where the sieve (not shown) provided in the nozzle 35 is used to adjust the particle size of the phosphors 20 disposed on the applied adhesive 21, but a method other than the sieve may be used. A method, other than the sieve, for adjusting the particle size of the sprayed phosphors 20 may be, for example, that the phosphors 20, after pulverized, washed, separated, and dried by a ball mill, are put in a shuttle and the inside diameter of a nozzle attached to a tip of the shuttle is adjusted.

EXAMPLE

The present invention will be described by using an example and comparative examples.

An example 1 described below is the result of measuring tone unevenness of the light-emitting device 1 according to the embodiment of the present invention, and comparative examples 1 to 3 are the results of measuring tone unevenness of light-emitting devices 200, 201, 202 respectively. With the use of the tone unevenness measuring device 70 shown in FIG. 9, the tone unevenness was measured based on the results of spectrum analysis of light emitted from each of the light-emitting devices as objects to be measured and detected by the detector 46. The measurement was conducted without an optical lens 51 provided between the light-emitting device 1 and the detector 46 and with the optical lens 51 provided therebetween to gather light, as shown in FIG. 9.

"A half power angle ($2\theta(\frac{1}{2})$)" indicating a directional characteristic of light emitted by the light-emitting device as an object to be measured was calculated as follows based on the analysis results of luminance obtained by the spectroscope 48.

$$2\theta(\frac{1}{2}) = |\theta_1 - \theta_2|$$

As for $\theta_1, \theta_2$, if the largest luminance value is defined as 100% and an angle at this time is defined as a reference angle, $\theta_1$ is an angle at which luminance becomes 50% when the light-emitting device is rotated toward the 0° position side from the reference angle and $\theta_2$ is an angle at which luminance becomes 50% when the light-emitting device is rotated toward the 180° position side from the reference angle.

"Color temperature difference (ΔCCT)" indicating the degree of tone unevenness of the light-emitting device as an object to be measured was calculated as a difference between the maximum value and the minimum value of color temperature CCT (Correlated Color Temperature) which was measured within the aforesaid half power angle (2θ(½)), based on the spectrum analysis results obtained by the spectroscope 48. Its unit is K (Kelvin).

As for a color rendering property of light emitted by the light-emitting device as an object to be measured, "an average color rendering index (Ra)" indicating the degree of faithful reproduction of standard light specified by JIS was calculated based on the spectrum analysis results obtained by the spectroscope 48.

Example 1

The light-emitting device 1 shown in FIG. 2 was formed in which the three different phosphor layers 10, 11, 12 were stacked directly on the light-emitting element 5 emitting ultraviolet light whose main emission wavelength was 405 nm. In the example 1, $CaAlSiN_3$:Eu was used as the phosphors 20 contained in the phosphor layer 10, $SrAl_{1+x}Si_{4-x}O_xN_{7-x}$:Ce was used as the phosphors 25 contained in the phosphor layer 11, and $SrAl_xSi_{6-x}O_{1+x}N_{8-x}$:Eu was used as the phosphors 27 contained in the phosphor layer 12. A particle size of the phosphors 20 was adjusted to 10 μm or less, a particle size of the phosphors 25 was adjusted to 13 μm or less, and a particle size of the phosphors 27 was adjusted to 20 μm or less.

When a cross section of the above sample was observed, occupancy ratios of the phosphors 20, the phosphors 25, and the phosphors 27 in the phosphor layer 10, the phosphor layer 11, and the phosphor layer 12 were all 50% or more, specifically 60%. Thickness variation (difference between the maximum thickness and the minimum thickness) of each of the phosphor layer 10, the phosphor layer 11, and the phosphor layer 12 was equal to or less than two times an average particle size of each of the phosphors 20, the phosphors 25, and the phosphors 27 contained in the respective layers. The average particle sizes of the phosphors 20, 25, 27 contained in the phosphor layers 10, 11, 12 were 7 μm, 10 μm, and 18 μm respectively.

Figure 15:
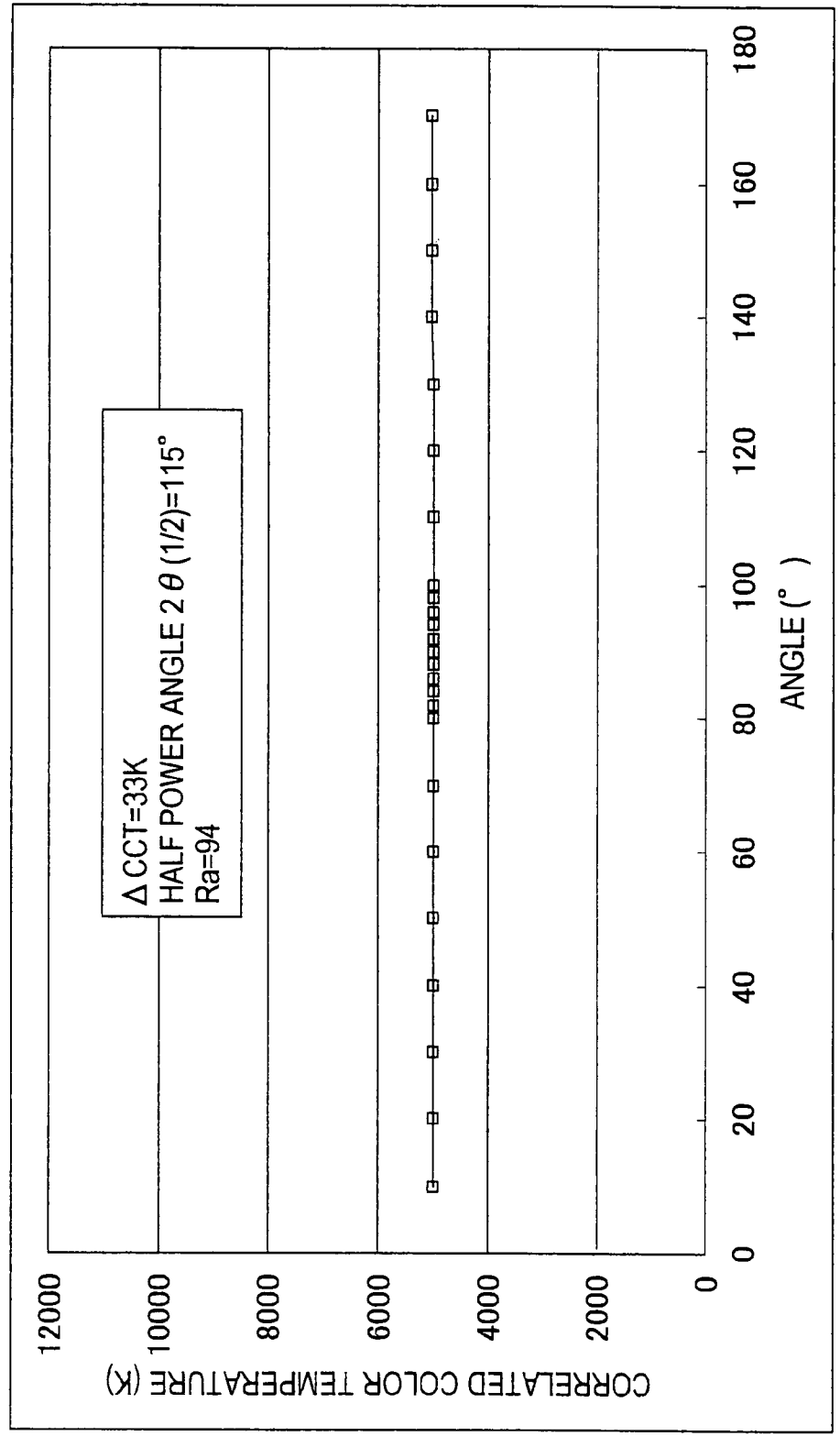
FIG. 15 is a chart showing measurement results of a luminance ratio and correlated color temperature of the light-emitting device 1 shown in FIG. 2 (without a lens), the measurement results being plotted on coordinates with angle (°) of the light-emitting device 1 taken on the horizontal axis and correlated color temperature (K) taken on the vertical axis.
Figure 16:
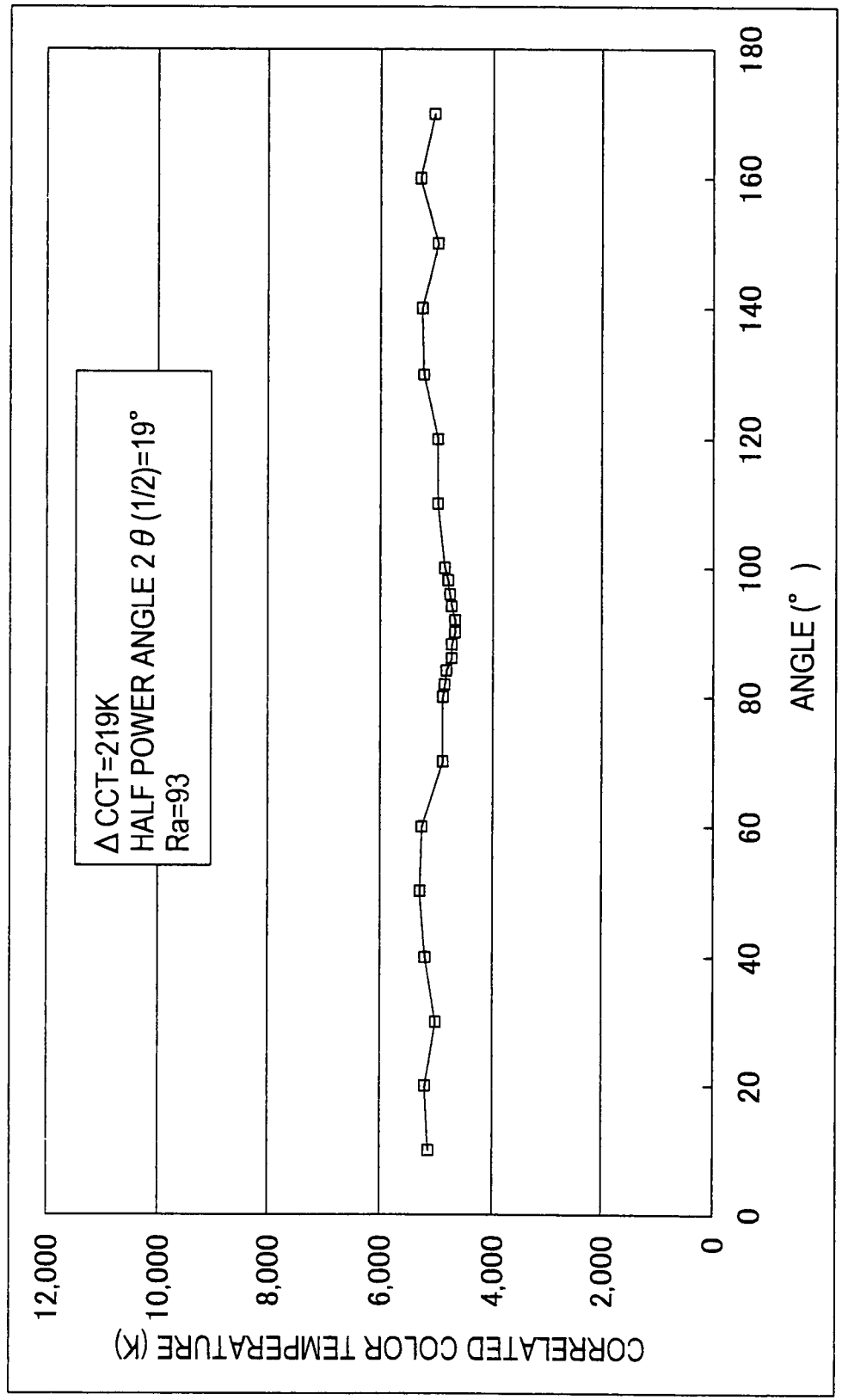
FIG. 16 is a chart showing measurement results of a luminance ratio and correlated color temperature of the light-emitting device 1 shown in FIG. 2 (with a lens), the measurement results being plotted on coordinates with angle (°) of the light-emitting device 1 taken on the horizontal axis and correlated color temperature (K) taken on the vertical axis.

While the position of the light-emitting device 1 was varied in a range from 0° to 180°, values of a luminance ratio and correlated color temperature of the above-described light-emitting device 1 were measured by using the tone unevenness measuring device 70 shown in FIG. 9. FIG. 15 shows the measurement results when the measurement was conducted without the optical lens 51, and FIG. 16 shows the measurement results when the measurement was conducted with the optical lens 51 used to gather light. In FIG. 15 and FIG. 16, the measurement results are shown, being plotted on coordinates with angle (°) of the light-emitting device 1 taken on the horizontal axis and correlated color temperature (K) taken on the vertical axis. FIG. 17 shows the measurement results in FIG. 15, and FIG. 18 shows the measurement results in FIG. 16.

As is seen in FIG. 15 and FIG. 17, without the lens, the half power angle (2θ(½)) was 115°, the color temperature difference ΔCCT was 33 K, and the average color rendering index (Ra) at the reference angle (90°) at which luminance had the largest value was 94, and thus the average color rendering index (Ra) in the half power angle range was 90 or more. As is seen in FIG. 16 and FIG. 18, with the lens used to gather light, the half power angle (2θ(½)) was 19°, the color temperature difference ΔCCT was 219 K, and the average color rendering index (Ra) at the reference angle (90°) at which luminance had the largest value was 93, and thus the average color rendering index (Ra) in the half power angle range was 90 or more. From the above results, according to the light-emitting device 1 of the present invention, favorable white light with a small color temperature difference and the average color rendering index (Ra) of 90 or more was obtained also when the optical element was used to gather light.

Comparative Example 1

Figure 19:
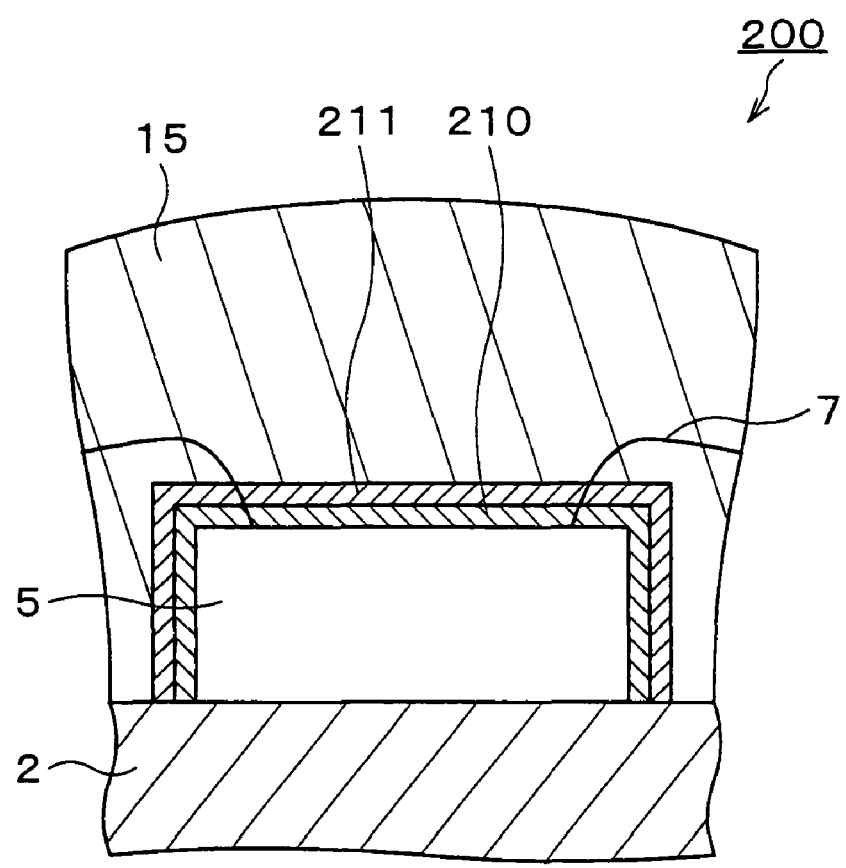
FIG. 19 is a view showing the structure of a light-emitting device 200 as a comparative example 1.

As the comparative example 1, the light-emitting device 200 shown in FIG. 19 was formed. The light-emitting device 200 is structured such that a phosphor layer 210 containing the phosphors 20 emitting red light and a phosphor layer 211 containing the phosphors 25 emitting green light are stacked in sequence on the light-emitting surfaces of the light-emitting element 5 which is disposed on the substrate 2 to emit blue light, and thick resin 15 is disposed around them.

When a cross section of the above sample was observed, occupancy ratios of the phosphors 20 and the phosphors 25 in the phosphor layer 210 and the phosphor layer 211 were both 50% or more, specifically 60%. Thickness variation (difference between the maximum thickness and the minimum thickness) of the phosphor layer 210 and thickness variation of the phosphor layer 211 were equal to or less than two times average particle sizes of the phosphors 20 and the phosphors 25 contained in the phosphor layer 210 and the phosphor layer 211 respectively. The average particle sizes of the phosphors 20, 25 contained in the phosphor layers 210, 211 were 7 μm and 10 μm respectively.

Figure 20:
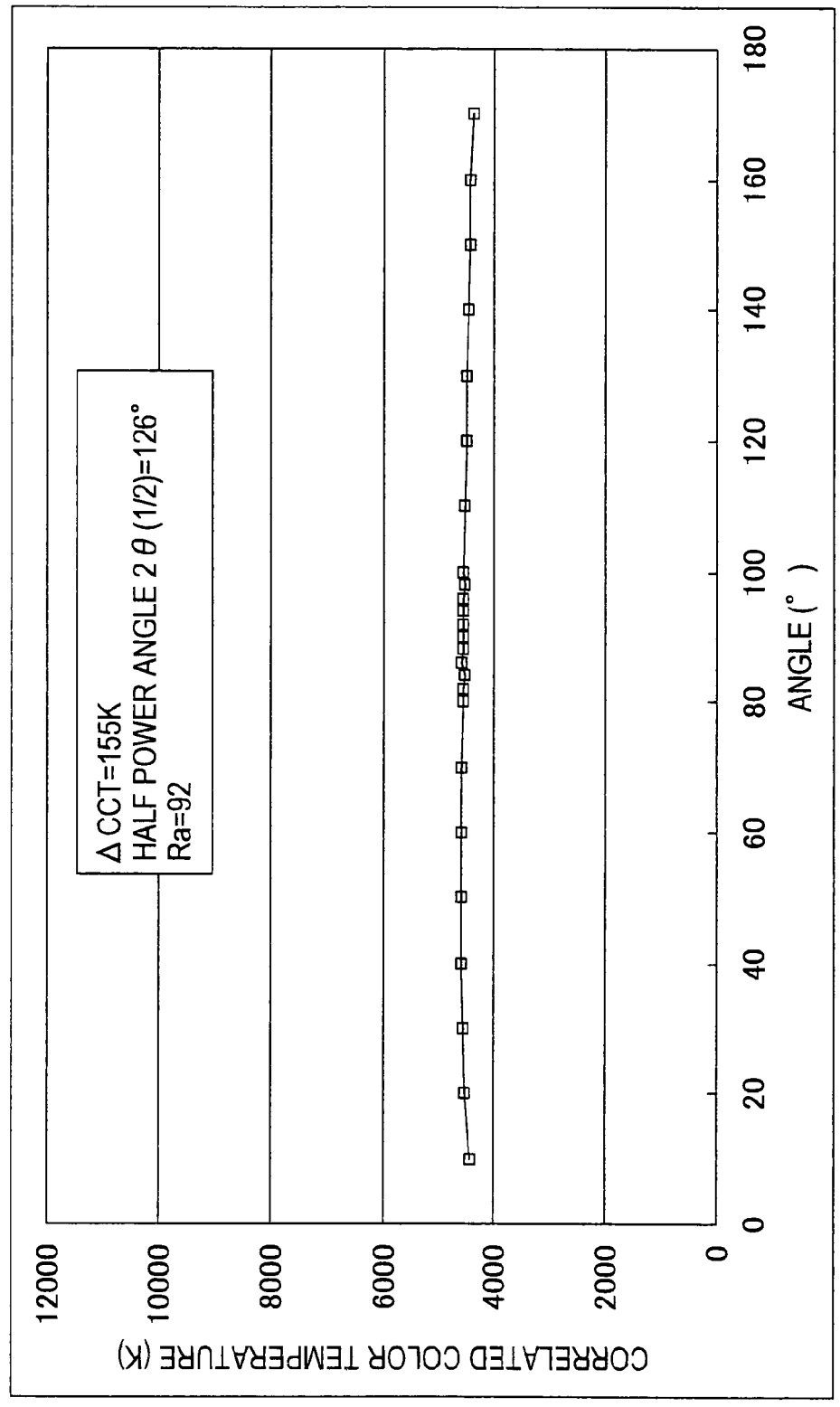
FIG. 20 is a chart showing measurement results of a luminance ratio and correlated color temperature of the light-emitting device 200 as the comparative example 1 shown in FIG. 19 (without a lens), the measurement results being plotted on coordinates with angle (°) of the light-emitting device 200 taken on the horizontal axis and correlated color temperature (K) taken on the vertical axis.
Figure 21:
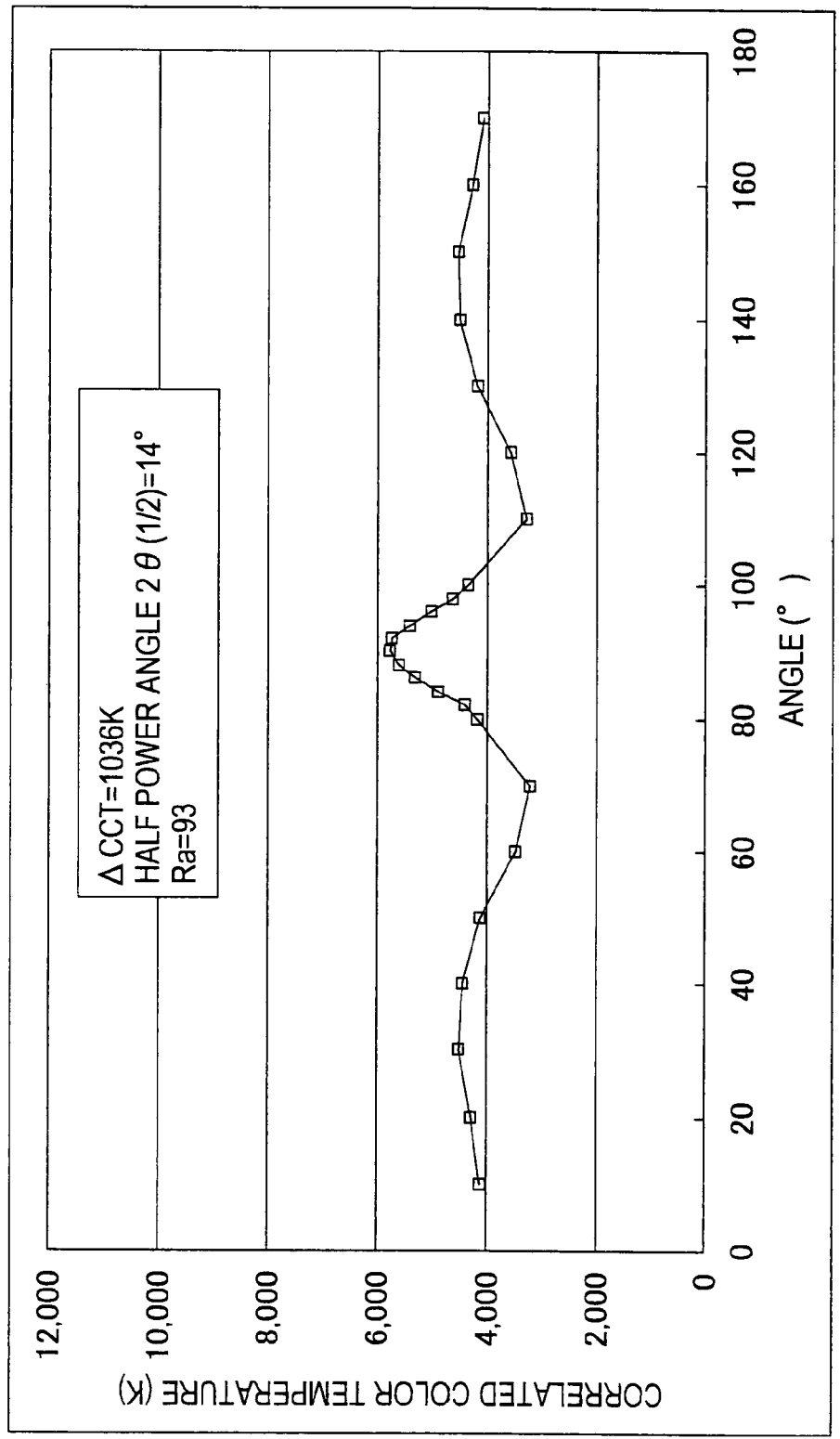
FIG. 21 is a chart showing measurement results of a luminance ratio and correlated color temperature of the light-emitting device 200 as the comparative example 1 shown in FIG. 19 (with a lens), the measurement results being plotted on coordinates with angle (°) of the light-emitting device 200 taken on the horizontal axis and correlated color temperature (K) taken on the vertical axis.

While the position of the light-emitting device 200 was varied in a range from 0° to 180°, values of a luminance ratio and correlated color temperature of the above-described light-emitting device 200 were measured by using the tone unevenness measuring device 70 shown in FIG. 9. FIG. 20 shows the measurement results when the measurement was conducted without the optical lens 51, and FIG. 21 shows the measurement results when the measurement was conducted with the optical lens 51 used to gather light. In FIG. 20 and FIG. 21, the measurement results are shown, being plotted on coordinates with angle (°) of the light-emitting device 200 taken on the horizontal axis and correlated color temperature (K) taken on the vertical axis. FIG. 22 shows the measurement results in FIG. 20, and FIG. 23 shows the measurement results in FIG. 21.

As is seen in FIG. 20 and FIG. 22, without the lens, the half power angle (2θ(½)) was 126°, the color temperature difference ΔCCT was 155K, and the average color rendering index (Ra) at the reference angle (90°) at which luminance had the largest value was 92, and thus the average color rendering index (Ra) in the half power angle range was 90 or more. However, with the lens used to gather light, the half power angle (2θ(½)) was 14°, and the color temperature difference ΔCCT was 1036K, and thus the color temperature difference had a far greater value, as shown in FIG. 21 and FIG. 23. It was ascertained that tone unevenness is amplified when the lens is used for light emitted from the light-emitting device 200.

Comparative Example 2

Figure 24:
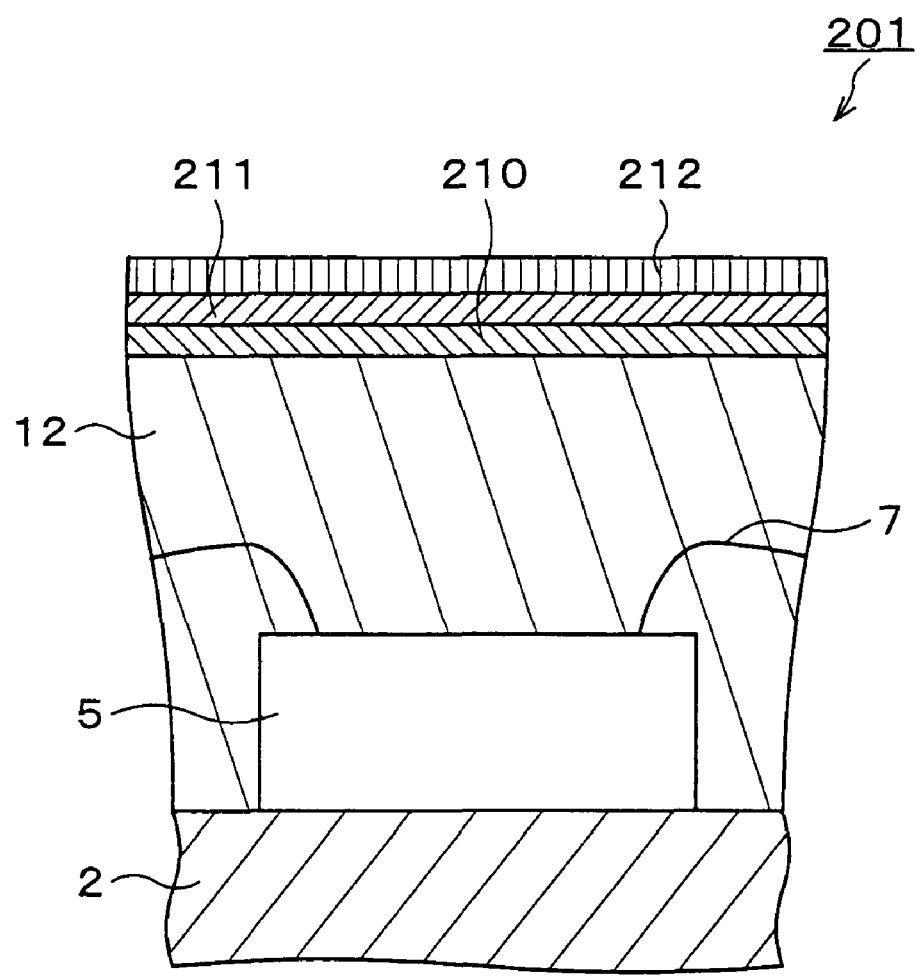
FIG. 24 is a view showing a light-emitting device 201 as a comparative example 2.

As the comparative example 2, the light-emitting device 201 shown in FIG. 24 was formed. The light-emitting device 201 is structured such that resin is disposed as an intermediate layer 12 on the light-emitting surfaces of the light-emitting element 5 which is disposed on the substrate 2 to emit ultraviolet light, and a thin layer composed of the mixture of the phosphor layer 210 containing the phosphors 20 emitting red light, the phosphor layer 211 containing the phosphors 25 emitting green light, and the phosphor layer 212 containing the phosphors 27 emitting blue light is disposed at a position apart from the light-emitting element 5 via the intermediate layer 12.

When a cross section of the above sample was observed, occupancy ratios of the phosphors 20, the phosphors 25, and the phosphors 27 in the phosphor layer 210, the phosphor layer 211, and the phosphor layer 212 were all 50% or more, specifically 60%. Thickness variations (difference between the maximum thickness and the minimum thickness) of the phosphor layer 210, the phosphor layer 211, and the phosphor layer 212 were equal to or less than two times average particle sizes of the phosphors 20, the phosphors 25, and the phosphors 27 contained in the respective layers. The average particle sizes of the phosphors 20, 25, 27 contained in the phosphor layers 210, 211, 212 were 7 μm, 10 μm, and 18 μm respectively.

Figure 25:
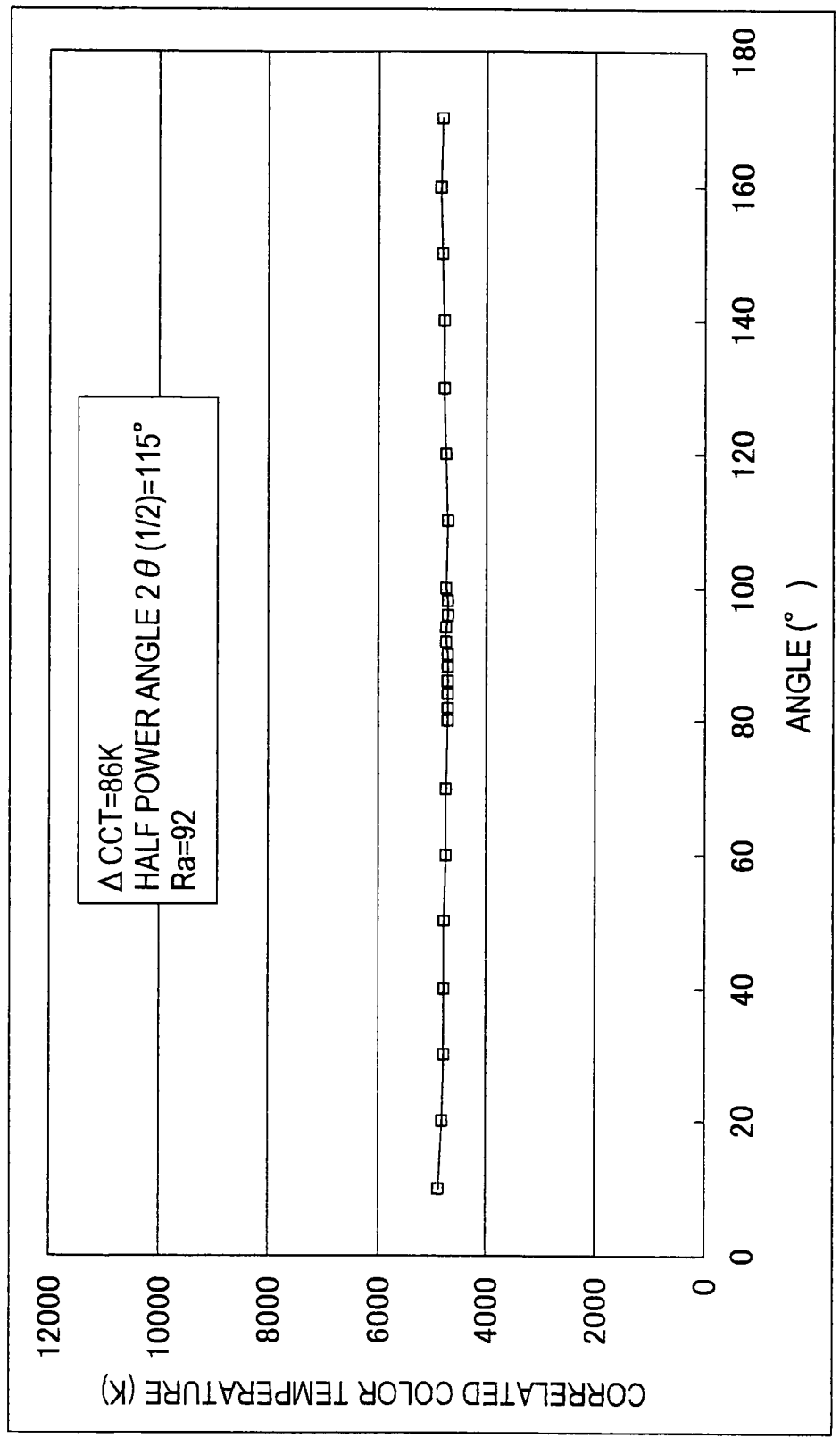
FIG. 25 is a chart showing measurement results of a luminance ratio and correlated color temperature of the light-emitting device 201 as the comparative example 2 shown in FIG. 24 (without a lens), the measurement results being plotted on coordinates with angle (°) of the light-emitting device 201 taken on the horizontal axis and correlated color temperature (K) taken on the vertical axis.
Figure 26:
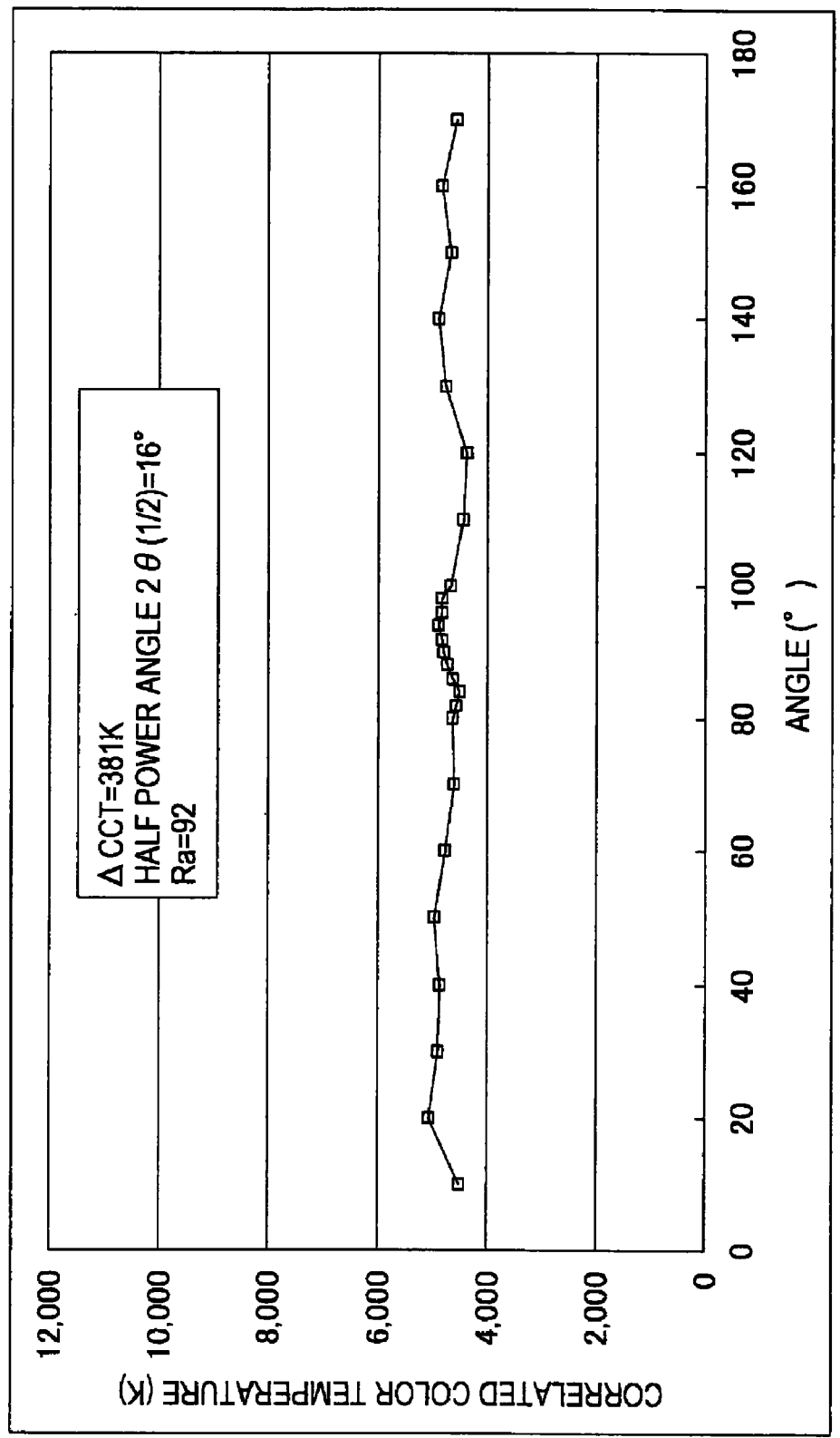
FIG. 26 is a chart showing measurement results of a luminance ratio and correlated color temperature of the light-emitting device 201 as the comparative example 2 shown in FIG. 24 (with a lens), the measurement results being plotted on coordinates with angle (°) of the light-emitting device 201 taken on the horizontal axis and correlated color temperature (K) taken on the vertical axis.

While the position of the light-emitting device 201 was varied in a range from 0° to 180°, values of a luminance ratio and correlated color temperature of the above-described light-emitting device 201 were measured by using the tone unevenness measuring device 70 shown in FIG. 9. FIG. 25 shows the measurement results when the measurement was conducted without the optical lens 51, and FIG. 26 shows the measurement results when the measurement was conducted with the optical lens 51 used to gather light. In FIG. 25 and FIG. 26, the measurement results are shown, being plotted on coordinates with angle (°) of the light-emitting device 201 taken on the horizontal axis and correlated color temperature (K) taken on the vertical axis. FIG. 27 shows the measurement results in FIG. 25, and FIG. 28 shows the measurement results in FIG. 26.

As is seen in FIG. 25 and FIG. 27, without the lens, the half power angle (2θ(½)) was 115°, the color temperature difference ΔCCT was 86K, and the average color rendering index (Ra) at the reference angle (90°) at which luminance had the largest value was 92, and thus the average color rendering index (Ra) in the half power angle range was 90 or more. However, with the lens used to gather light, the half power angle (2θ(½)) was 16°, and the color temperature difference ΔCCT was 381K, and thus the color temperature difference had a greater value, as shown in FIG. 26 and FIG. 28. It was ascertained that tone unevenness is amplified when the lens is used for light emitted from the light-emitting device 201.

Comparative Example 3

Figure 29:
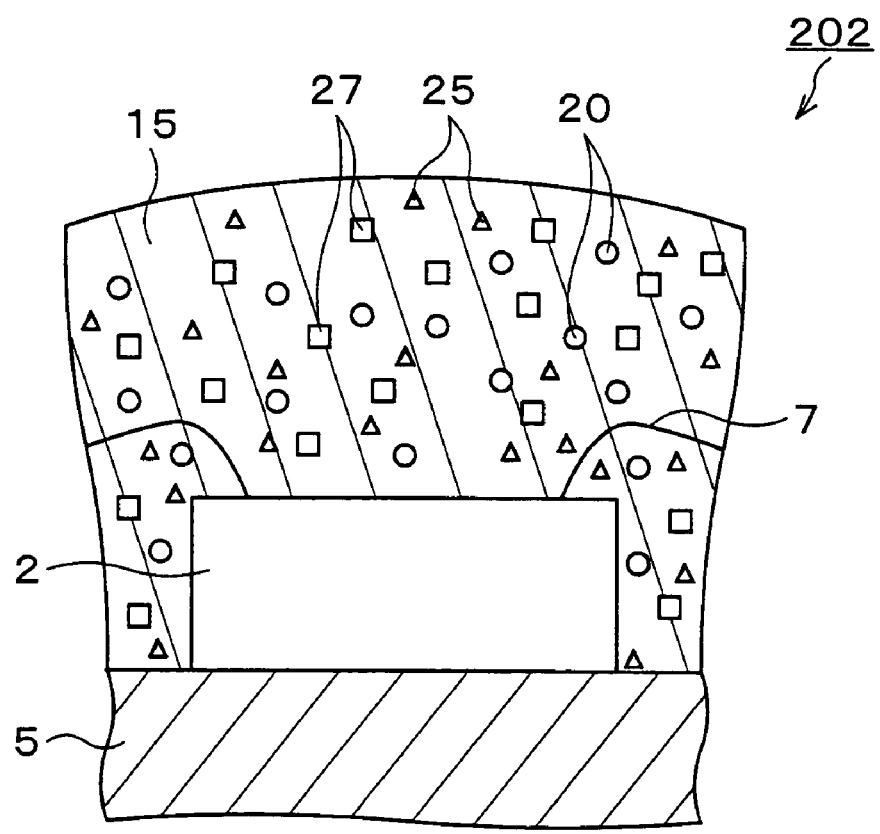
FIG. 29 is a view showing the structure of a light-emitting device 202 as a comparative example 3.

As the comparative example 3, the light-emitting device 202 shown in FIG. 29 was formed. The light-emitting device 202 is structured such that thick resin in which the phosphors 20 emitting red light, the phosphors 25 emitting green light, and the phosphors 27 emitting blue light are mixed is disposed around the light-emitting element 5 which is disposed on the substrate 2 to emit ultraviolet light. Particle sizes of the phosphors 20, 25, 27 were not adjusted.

When a cross section of the above sample was observed, the total occupancy ratio of the phosphors 20, 25, 27 in the resin 15 was 50% or less, specifically 5%. Thickness variation (difference between the maximum thickness and the minimum thickness) of the layer of the resin 15 exceeded a value equal to two times average particle sizes of the contained phosphors 20, 25, 27. The average particle sizes of the phosphors 20, 25, 27 were 7 μm, 10 μm, and 18 μm respectively.

Figure 30:
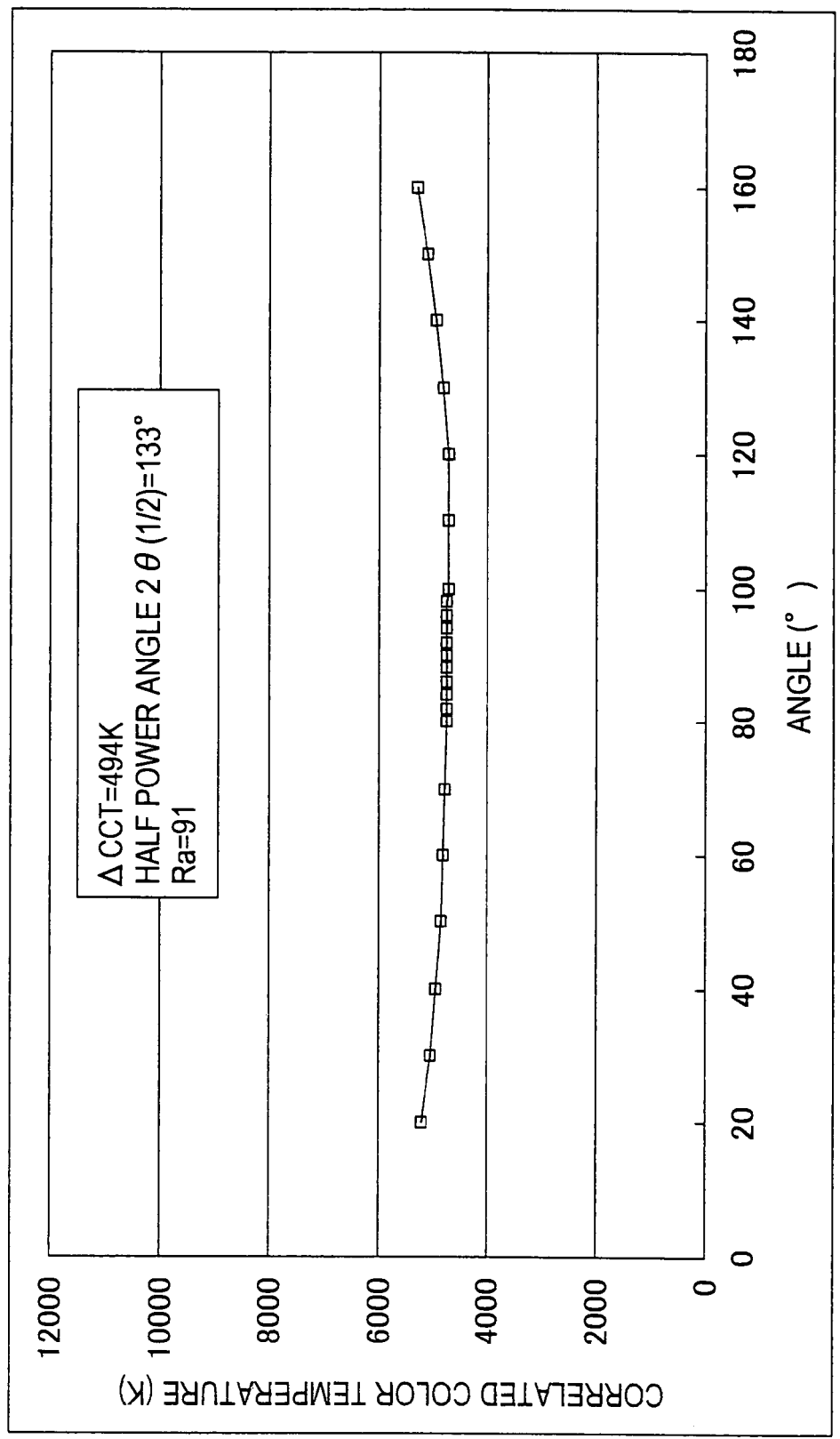
FIG. 30 is a chart showing measurement results of a luminance ratio and correlated color temperature of the light-emitting device 202 as the comparative example 3 shown in FIG. 29 (without a lens), the measurement results being plotted on coordinates with angle (°) of the light-emitting device 202 taken on the horizontal axis and correlated color temperature (K) taken on the vertical axis.
Figure 31:
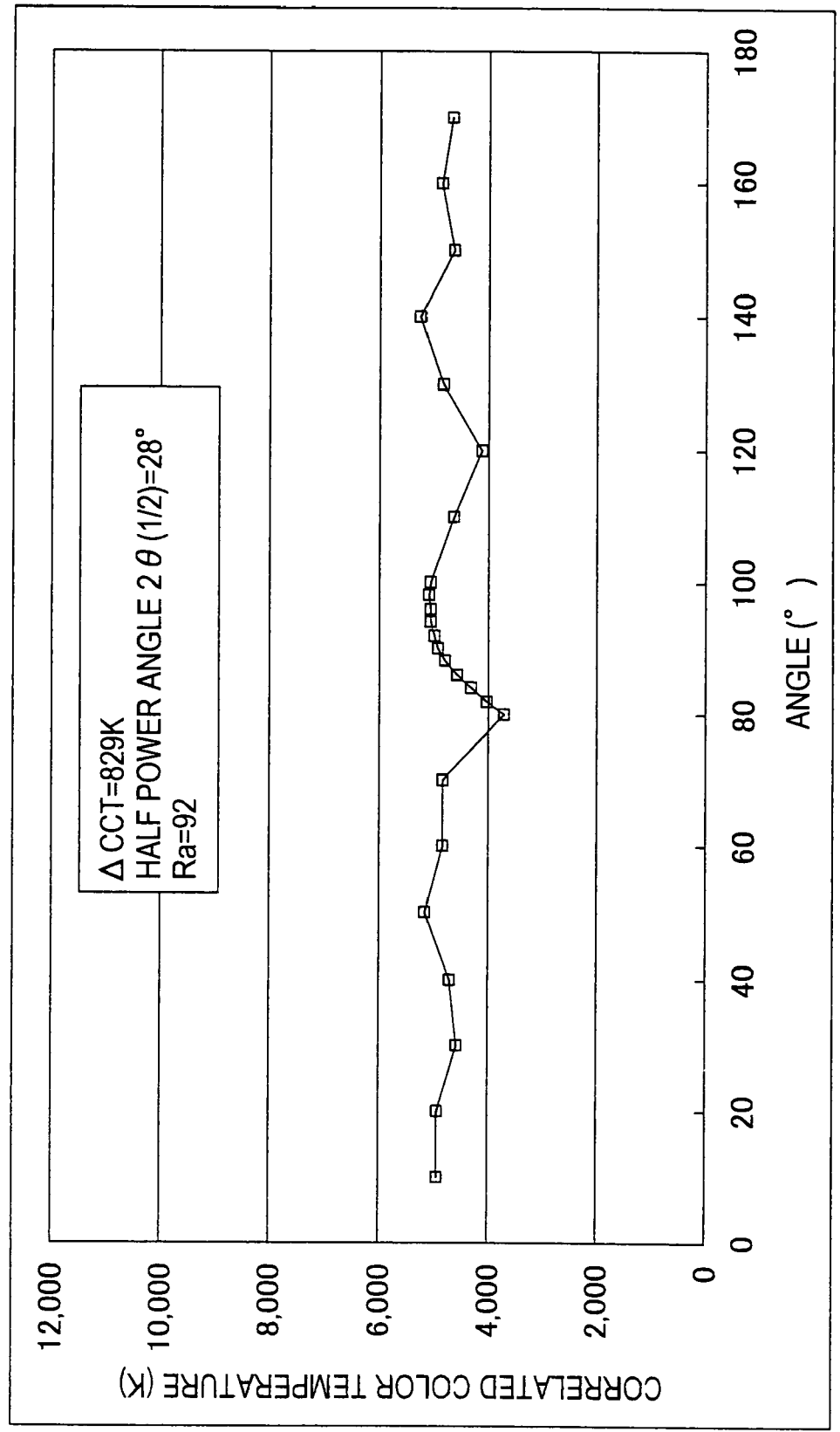
FIG. 31 is a chart showing measurement results of a luminance ratio and correlated color temperature of the light-emitting device 202 as the comparative example 3 shown in FIG. 29 (with a lens), the measurement results being plotted on coordinates with angle (°) of the light-emitting device 202 taken on the horizontal axis and correlated color temperature (K) taken on the vertical axis.

While the position of the light-emitting device 202 was varied in a range from 0° to 180°, values of a luminance ratio and correlated color temperature of the above-described light-emitting device 202 were measured by using the tone unevenness measuring device 70 shown in FIG. 9. FIG. 30 shows the measurement results when the measurement was conducted without the optical lens 51, and FIG. 31 shows the measurement results when the measurement was conducted with the optical lens 51 used to gather light. In FIG. 30 and FIG. 31, the measurement results are shown, being plotted on coordinates with angle (°) of the light-emitting device 202 taken on the horizontal axis and correlated color temperature (K) taken on the vertical axis. FIG. 32 shows the measurement results in FIG. 30, and FIG. 33 shows the measurement results in FIG. 31.

As is seen in FIG. 30 and FIG. 32, without the lens, the half power angle (2θ(½)) was 133°, the color temperature difference ΔCCT was 494 K, and the average color rendering index (Ra) at the reference angle (90°) at which luminance had the largest value was 91, and thus the average color rendering index (Ra) in the half power angle range was 90 or more. With the lens used to gather light, the half power angle (2θ(½)) was 28°, and the color temperature difference ΔCCT was 829 K as shown in FIG. 31 and FIG. 33. From the results, it was ascertained that light emitted from the light-emitting device 202 had a large color temperature difference and had great tone unevenness, irrespective of the presence/absence of the lens.

It is seen from the example 1 and the comparative examples 1 to 3, in the light-emitting device 1 of the present invention (the example 1), the value of the color temperature difference ΔCCT indicating the degree of tone unevenness is 219 K for a 19° half power angle, while the value of the color temperature difference ΔCCT is 381 K to 1036 K for 14° to 28° half power angles in the light-emitting devices 200 to 202 (the comparative examples 1 to 3), and therefore, it is understood from the comparison that tone unevenness of light emitted by the light-emitting device 1 is far smaller. Further, the value of the average color rendering index Ra in the example 1 regarding the light-emitting device 1 of the present invention is 93. This means that white light emitted by the light-emitting device 1 of the present invention can be the reproduction of light closer to the standard light. It is seen that this white light has effectively reduced directivity since the phosphor layers 10, 11, 12 contain the non-directional phosphors 20, 25, 27 and the white light is obtained by the synthesis of lights therefrom.

What is claimed is:

1. A light-emitting device comprising:
   a light-emitting element whose main emission wavelength is 410 nm or less; and
   one phosphor layer or more stacked directly on a light-emitting surface of said light-emitting element and containing phosphors that absorb light from said light-emitting element and wavelength-convert the absorbed light to emit light, wherein said phosphor layer is composed of two or more stacked phosphor forming layers in each of which the phosphors are disposed on an adhesive whose thickness is equal to or less than an average particle size of the phosphors, and wherein a difference between a maximum thickness and a minimum thickness of said phosphor layer is equal to or less than two times an average particle size of the phosphors, and an occupancy ratio of the phosphors in said phosphor layer is 50% or more.

2. The light-emitting device according to claim 1, wherein said phosphor layer is composed of a plurality of phosphor layers containing different phosphors, and the difference between the maximum thickness and the minimum thickness of the phosphor layer closest to said light-emitting element, among said plural phosphor layers, is equal to or less than two times the average particle size of the phosphors contained in the phosphor layer closest to said light-emitting element.

3. The light-emitting device according to claim 1, wherein a thickness of said phosphor layer is equal to or less than five times the average particle size of the phosphors.

4. The light-emitting device according to claim 1, wherein said phosphor layer is stacked in two layers or more on the light-emitting surface of said light-emitting element, and wherein a main emission wavelength of the phosphors contained in the phosphor layer closest to said light-emitting element is different from a main absorption wavelength of the phosphors contained in the phosphor layer farthest from said light-emitting element.

5. The light-emitting device according to claim 1, wherein the occupancy ratio of the phosphors in the phosphor forming layer farthest from said light-emitting element, among the two or more phosphor forming layers, is 50% or less and an occupancy ratio of the phosphors in the other phosphor forming layers is 60% or more.

6. The light-emitting device according to claim 1, wherein the phosphors have an adjusted particle size.

* * * * *